US008736731B2

(12) United States Patent
Noudo

(10) Patent No.: US 8,736,731 B2
(45) Date of Patent: May 27, 2014

(54) SOLID-STATE IMAGING DEVICE AND ELECTRONIC APPARATUS HAVING BIASEDLY LOCATED INTER-PIXEL LIGHT SHIELDING UNITS TO MINIMIZE COLOR MIXING

(75) Inventor: Shinichiro Noudo, Kumamoto (JP)

(73) Assignee: Sony Corporation, Tokyo (JP)

( * ) Notice: Subject to any disclaimer, the term of this patent is extended or adjusted under 35 U.S.C. 154(b) by 82 days.

(21) Appl. No.: 13/403,020

(22) Filed: Feb. 23, 2012

(65) Prior Publication Data

US 2012/0242874 A1 Sep. 27, 2012

(30) Foreign Application Priority Data

Mar. 24, 2011 (JP) ................................. 2011-065621

(51) Int. Cl.
H04N 5/335 (2011.01)
H04N 3/14 (2006.01)
H04N 5/225 (2006.01)

(52) U.S. Cl.
USPC .......................................... 348/302; 348/340

(58) Field of Classification Search
USPC .................. 348/294, 340, 272–277
See application file for complete search history.

(56) References Cited

U.S. PATENT DOCUMENTS

| 2010/0110271 A1* | 5/2010 | Yanagita et al. ............... 348/340 |
| 2010/0201834 A1* | 8/2010 | Maruyama et al. ......... 348/222.1 |
| 2010/0253819 A1* | 10/2010 | Yokozawa ..................... 348/273 |
| 2011/0058075 A1* | 3/2011 | Yanagita et al. ............... 348/273 |

FOREIGN PATENT DOCUMENTS

| JP | 2010-109295 | 5/2010 |
| JP | 2010-186818 | 8/2010 |

* cited by examiner

Primary Examiner — Tuan Ho
Assistant Examiner — Shahbaz Nazrul
(74) Attorney, Agent, or Firm — Rader, Fishman & Grauer PLLC

(57) ABSTRACT

A solid-state imaging device which includes a pixel region which is provided on a semiconductor substrate, and in which a plurality of pixels including a photoelectric conversion unit having a photoelectric conversion function is arranged, a wiring layer which is provided at one plate surface of the semiconductor substrate, a color filter layer which is divided into a plurality of color filters provided corresponding to each pixel of the plurality of pixels which is arranged in the pixel region, and an inter-pixel light shielding unit which is provided in a boundary portion between the pixels adjacent to each other, between the semiconductor substrate and the color filter layer.

19 Claims, 19 Drawing Sheets

SOLID-STATE IMAGING DEVICE AND ELECTRONIC APPARATUS HAVING BIASEDLY LOCATED INTER-PIXEL LIGHT SHIELDING UNITS TO MINIMIZE COLOR MIXING

BACKGROUND

The present technology relates to a solid-state imaging device and an electronic apparatus including the solid-state imaging device.

There is a CMOS (Complementary Metal Oxide Semiconductor) solid-state imaging device as one solid-state imaging device which is used in electronic apparatuses such as digital still cameras, digital video cameras, or the like.

The CMOS solid-state imaging device includes a semiconductor substrate which is formed of silicon, or the like, and includes a pixel region in which a plurality of pixels is arranged, for example, in a matrix shape, on the semiconductor substrate. Each pixel which is arranged in the pixel region is configured by a photodiode as a light receiving element having a photoelectric conversion function, and a plurality of MOS transistors.

In the CMOS solid-state imaging device, a wiring layer in which, for example, a plurality of wirings is laminated inter layers through an insulating film is provided on one plate surface of the semiconductor substrate. In addition, the CMOS solid-state imaging device has a color filter layer, and a plurality of micro lenses on the side where the semiconductor substrate is irradiated with light.

The color filter layer is divided into a plurality of color filters for each photodiode which configures each of the pixels. Each of the color filters is a filter portion of any color of, for example, red, green, and blue, and transmits light of each color component. A micro lens is formed for each pixel, corresponding to the photodiode configuring each pixel. The micro lens condenses the input light from the outside to a photodiode of corresponding pixel.

For the CMOS solid-state imaging device with the above described configuration, there are a so-called front side illumination type and a backside illumination type. The front side illumination and the backside illumination are different from each other, since the input side of light with respect to the semiconductor substrate having the wiring layer on one plate surface side is the front side for the front side illumination, and the rear side for the backside illumination.

Specifically, in the front side illumination CMOS solid-state imaging device, the color filter layer and the micro lens are formed through the wiring layer which is provided on one side of the semiconductor substrate with respect to the semiconductor substrate. That is, in the structure of the front side illumination, the wiring layer is provided on the side where the light is input with respect to the semiconductor substrate.

On the contrary, in the backside illumination CMOS solid-state imaging device, the color filter layer and the micro lens are formed on the side opposite to the side where the wiring layer is provided with respect to the semiconductor substrate. That is, in the structure of the backside illumination, the wiring layer is provided on the side opposite to the side where the light is input with respect to the semiconductor substrate.

Due to the above described difference in the structure of the front side illumination and the backside illumination, there are operational differences between both as follows. In a case of the front side illumination, the light which is input from the micro lens side transmits the color filter layer, passes through the inside of the wiring layer, and then is received by the photodiode of each pixel which configures the pixel region.

In contrast to this, in a case of the backside illumination, the light which is input from the micro lens side passes through the color filter layer, and is received by the photodiode of the pixel without passing through the wiring layer. For this reason, according to the structure of the backside illumination, since the light which is input from the micro lens side is received by the photodiode of the pixel without being blocked by the wiring layer, it is possible to secure the actual light receiving area of the photodiode widely, and to improve the sensitivity thereof.

However, there is a problem in the Back side illumination CMOS solid-state imaging device as follows, since the wiring layer is not present on the side where the light is input with respect to the semiconductor substrate. First, in the structure of the backside illumination, it is very difficult to suppress optical color mixing completely. Here, the optical color mixing is a phenomenon in which, in a border portion of pixels where pixels with different colors from each other are close to each other, a part of light which is input to the micro lens corresponding to pixels of one color is input to the photodiode of pixels of the other color.

In addition, in the Back side illumination CMOS solid-state imaging device, for example, when a high intensity light source such as the sun or the like is photographed, there may be a magenta colored stripe shaped pixel defect (hereinafter, referred to as "Mg flare") which is referred to as magenta flare, or the like. The Mg flare occurs as follows.

A part of the light which is input from the micro lens toward the photodiode side of the pixel becomes light which goes toward the micro lens side from the photodiode side as reflected light or diffracted light. The reflected light or the diffracted light passing through the micro lens, or the like, is reflected by seal glass which covers the micro lens, or the like, in the package of the CMOS solid-state imaging device, and is input from the micro lens again toward the photodiode side. The light which is input to the photodiode side again in this manner causes the optical color mixing to uniformly occur in pixels of each color of, for example, red, green, and blue.

In addition, in the CMOS solid-state imaging device, processing, which is referred to as white balance processing, is performed so as to arrange spectral characteristics of light of each color component, in the process of signal processing. According to the white balance processing, for example, when the color filter layers are divided into three color filters of red, green, and blue, the red and blue signals have a larger gain than the green signal, and are emphasized. The Mg flare occurs due to such a white balance processing which is performed in a state where each color pixel is uniformly mixed, as described above.

In order to solve the problem in the above described backside illumination structure, the technology described in Japanese Unexamined Patent Application Publication No. 2010-186818 has been proposed, and has come into practical use. In the technology in Japanese Unexamined Patent Application Publication No. 2010-186818, a light shielding film is formed through an insulating layer in the pixel boundary on the light receiving surface of the photodiode, that is, between the adjacent pixels, in between the semiconductor substrate on which the photodiode is formed and the color filter layer.

The technology in Japanese Unexamined Patent Application Publication No. 2010-186818 is considered to be reliably effective when it comes to suppressing the above described optical color mixing and Mg flare. However, according to the technology in Japanese Unexamined Patent Application Publication No. 2010-186818, the sensitivity may be decreased, since a part of the light to be sensed by the pixel is blocked due to the light shielding film which is formed between the adjacent pixels. The degree of decrease in sensitivity due to the light shielding film which is formed between the adjacent pixels depends on the pixel pitches between the pixels in the CMOS solid-state imaging device, the line width of the light shielding film, a light condensing structure, or the like, however, there is a case where the sensitivity is decreased by about 10% in practice due to the light shielding film.

Therefore, in order to suppress such a decrease in sensitivity due to the light shielding film which is formed between the adjacent pixels, the technology described in Japanese Unexamined Patent Application Publication No. 2010-109295 has been proposed. The technology described in Japanese Unexamined Patent Application Publication No. 2010-109295 focuses on an electrostatic light shielding effect due forming the light shielding film from a metallic material, and forms the light shielding film using a non-conductive material such as amorphous silicon.

SUMMARY

According to the technology in Japanese Unexamined Patent Application Publication No. 2010-109295, it is considered that the decrease in sensitivity due to the electrostatic light shielding effect may be reliably suppressed by using the non-conductive material in the light shielding film. However, even in the technology in Japanese Unexamined Patent Application Publication No. 2010-109295, the effect of suppressing the decrease in sensitivity is limited due to the fact that the light to be sensed by the pixel is blocked because of the light shielding film.

It is desirable to provide a solid-state imaging device and an electronic apparatus in which optical color mixing, or Mg flare is suppressed, and sensitivity is improved.

According to an embodiment of the present technology, there is provided a solid-state imaging device which includes, a pixel region which is provided on a semiconductor substrate, and in which a plurality of pixels including a photoelectric conversion unit having a photoelectric conversion function is arranged; a wiring layer which is provided at one plate surface of the semiconductor substrate; a color filter layer which is divided into a plurality of color filters provided corresponding to each pixel of the plurality of pixels which is arranged in the pixel region; and an inter-pixel light shielding unit which is provided in a boundary portion between the pixels adjacent to each other, between the semiconductor substrate and the color filter layer, in which the plurality of pixels has a combination of different color pixels in which the colors of the color filter are different from each other, and a combination of the same color pixels in which the colors of the color filter are the same as each other, as the pixels which are adjacent to each other, due to the color of the color filter, and the inter-pixel light shielding units are biasedly located at the boundary portion of the combination of the different color pixels.

In addition, in the solid-state imaging device according to the present technology, the wiring layer and the color filter layer may be provided on a different plate surface side from each other with respect to the semiconductor substrate, and the inter-pixel light shielding unit may be a light shielding film.

In addition, the solid-state imaging device according to the present technology may further include, a peripheral circuit region which is provided at the periphery of the pixel region; and a peripheral light shielding film which is provided at the peripheral circuit region in between the semiconductor substrate and the color filter layer, and is located at the same layer as the light shielding film.

In addition, in the solid-state imaging device according to the present technology, the light shielding film may only be present at the boundary portion of the combination of the different color pixels, without being present at the boundary portion of the combination of the same color pixels.

In addition, in the solid-state imaging device according to the present technology, the light shielding film may be connected to a fixed potential.

In addition, in the solid-state imaging device according to the present technology, the plurality of light shielding films which is present at the boundary portion of the plurality of pixels may be electrically connected to each other by a transparent electrode.

In addition, in the solid-state imaging device according to the present technology, the wiring layer and the color filter layer may be provided at the same plate surface as each other with respect to the semiconductor substrate, and the inter-pixel light shielding unit is a wiring which configures the wiring layer.

In addition, the solid-state imaging device according to the present technology may further include, a signal processing circuit which performs processing of an output signal from each of the pixels, in which the signal processing circuit corrects an output value of the output signal from each of the pixels on the basis of the magnitude of a difference in sensitivity which occurs between the plurality of pixels due to a difference in the amount of the inter-pixel light shielding unit at the boundary portion which is present in the periphery of each of the pixels.

According to another embodiment of the present technology, there is provided an electronic apparatus which includes, a solid-state imaging device; and a drive unit which generates a driving signal for driving the solid-state imaging device, in which the solid-state imaging device includes, a pixel region which is provided on a semiconductor substrate, and in which a plurality of pixels including photoelectric conversion unit having a photoelectric conversion function is arranged; a wiring layer which is provided at one plate surface of the semiconductor substrate; a color filter layer which is divided into a plurality of color filters provided corresponding to each pixel of the plurality of pixels which is arranged in the pixel region; and an inter-pixel light shielding unit which is provided in a boundary portion between the pixels adjacent to each other, between the semiconductor substrate and the color filter layer, in which the plurality of pixels has a combination of different color pixels in which the colors of the color filter are different from each other, and a combination of the same color pixels in which the colors of the color filter are the same as each other, as the pixels which are adjacent to each other, due to the color of the color filter, and the inter-pixel light shielding units are biasedly located at the boundary portion of the combination of the different color pixels.

The electronic apparatus according to the present technology may further include, a shutter device for controlling an irradiation time and a light blocking time of light with which irradiates the solid-state imaging device, in which the drive unit corrects an output value of an output signal from each of the pixels on the basis of the magnitude of a difference in sensitivity which occurs between the plurality of pixels due to a difference in the amount of the inter-pixel light shielding unit at the boundary portion which is present in the periphery of each of the pixels.

According to the present technology, it is possible to suppress optical color mixing, or Mg flare, and to improve sensitivity.

DETAILED DESCRIPTION OF EMBODIMENTS

The present technology is to improve the sensitivity while suppressing the optical color mixing and the Mg flare by studying a layout of the inter-pixel light shielding unit which is provided at the boundary portion between the pixels which are adjacent to each other, in between the semiconductor substrate on which the plurality of pixels is arranged and the color filter layer which is divided into a plurality of color filters which is provided corresponding to each pixel.

Schematic Configuration of Solid-State Imaging Device

Figure 1:
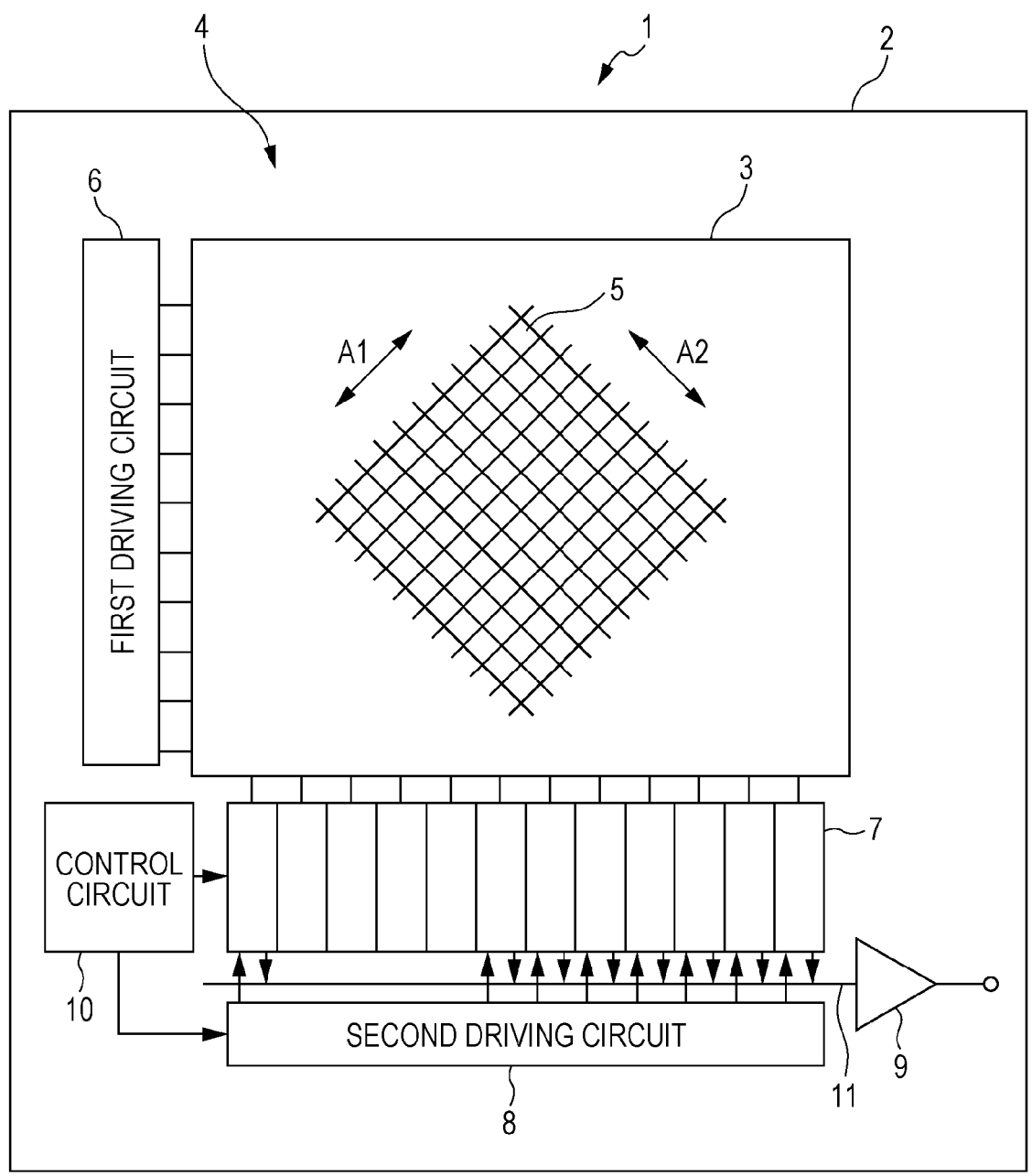
FIG. 1 is a diagram which shows a schematic configuration of a solid-state imaging device according to a first embodiment of the present technology.

The configuration of a solid-state imaging device 1 according to a first embodiment of the present technology will be described with reference to FIG. 1. The solid-state imaging device 1 according to the embodiment is a CMOS solid-state imaging device. The solid-state imaging device 1 has a semiconductor substrate 2 which is configured by a semiconductor such as silicon. The solid-state imaging device 1 includes a pixel region 3, and a peripheral circuit region 4 which is provided at the periphery of the pixel region 3.

The pixel region 3 is an image capturing area which is provided on the semiconductor substrate 2, and includes a plurality of pixels 5 which is provided in a predetermined array. The pixel region 3 includes an effective pixel region where a generation, an amplification, and reading out of a signal charge using photoelectric conversion in each pixel 5 is performed, and an optical black level region where optical black as the reference of a black level is output. In general, the optical black level region is formed at the outer periphery of the effective pixel region.

In the solid-state imaging device 1 according to the embodiment, the plurality of pixels 5 is arranged according to a so-called clear bit sequence, and is arranged in a diagonal matrix in a state of being diagonal by 45° with respect to the semiconductor substrate 2 having a rectangular shape when planarly viewed. The pixel 5 is formed on the semiconductor substrate 2. Since the clear bit sequence is used, as the array of the plurality of pixels 5 (hereinafter, referred to as "pixel array"), it is easy to secure a wide area of one pixel while maintaining a resolution.

In the solid-state imaging device 1 according to the embodiment, the clear bit sequence is used as the pixel array, however, the pixel array is not particularly limited. For example, a general square grid array may be adopted, in which the plurality of pixels 5 is arranged in a matrix in the longitudinal direction (orthogonal direction), or transverse direction (horizontal direction) planarly along the rectangular semiconductor substrate 2.

The pixel 5 is configured by a photodiode as the photoelectric conversion unit having the photoelectric conversion function, and a plurality of MOS transistors. The photodiode which configures the pixel 5 has a light receiving surface, and generates a signal charge of an amount corresponding to the intensity of input light. The pixel 5 has a transistor, for example, which takes in charge of amplifying, transmitting, selection, and resetting of the signal charge which is generated by the photodiode, respectively, as the plurality of MOS transistor.

The peripheral circuit region 4 includes a first driving circuit 6, a column signal processing circuit 7, a second driving circuit 8, an output circuit 9, and a control circuit 10.

The first driving circuit 6 is configured by, for example, a shift register, and drives the plurality of pixels 5 in the matrix which is diagonal by 45° in the sequence of a first direction (refer to arrow A1) as the arrangement direction corresponding to the row direction, or the column direction in the matrix arrangement. The first driving circuit 6 is connected by a pixel driving wiring with respect to the plurality of pixels 5.

The first driving circuit 6 supplies a driving pulse for driving the pixel 5 to the selected pixel driving wiring, by selecting the pixel driving wiring, and drives the pixel in the sequence of the first direction. The first driving circuit 6 sequentially selects and scans each pixel 5 in the pixel region 3 in the first direction, in the sequence of the first direction, and supplies a pixel signal based on the signal charge which is generated in the photodiode of each pixel 5 to the column signal processing circuit 7 through a predetermined signal line.

The column signal processing circuit 7 is a signal processing circuit which performs the processing of the output signal from each pixel 5. The column signal processing circuit 7 has elements for each sequence in a second direction which is orthogonal to the first direction in the arrangement direction corresponding to the row direction, or the column direction, in the matrix arrangement of the plurality of pixel 5. The column signal processing circuit 7 processes a signal which is output from the pixel 5 of one unit of the sequence in the first direction for each of the pixel 5 groups in the sequence of the second direction, using each element.

For the signal processing performed by the column signal processing circuit 7, there are, for example, CDS (Correlated Double Sampling) for reducing specific fixed pattern noise for each pixel 5, signal amplifying, AD (analog/digital) conversion, or the like. A selection switch (not shown) is provided at an output stage of the column signal processing circuit 7.

The second driving circuit 8 is configured by, for example, the shift register, sequentially selects each element of the column signal processing circuit 7 by sequentially outputting a scanning pulse in the second direction, and outputs the pixel signal to a predetermined signal line 11 from each element of the column signal processing circuit 7.

The output circuit 9 outputs a signal which is sequentially supplied through the signal line 11 from each element of the column signal processing circuit 7, by performing a predetermined signal processing. As the signal processing which is performed by the output circuit 9, for example, there are buffering, a black level adjustment, column dispersion compensation, various digital processing, or the like.

The control circuit 10 receives data for instructing an operation mode or the like, input clock, or the like, or outputs data such as internal information of the solid-state imaging device 1. The control circuit 10 generates the clock signal as the reference of operations of the first driving circuit 6, the column signal processing circuit 7, and the second driving circuit 8, or the control signal, and inputs the generated signal to each of the circuits 6, 7, and 8, on the basis of a synchronous signal and master clock in each of the first and second directions in the pixel array.

Detailed Configuration of Solid-State Imaging Device

Figure 2:
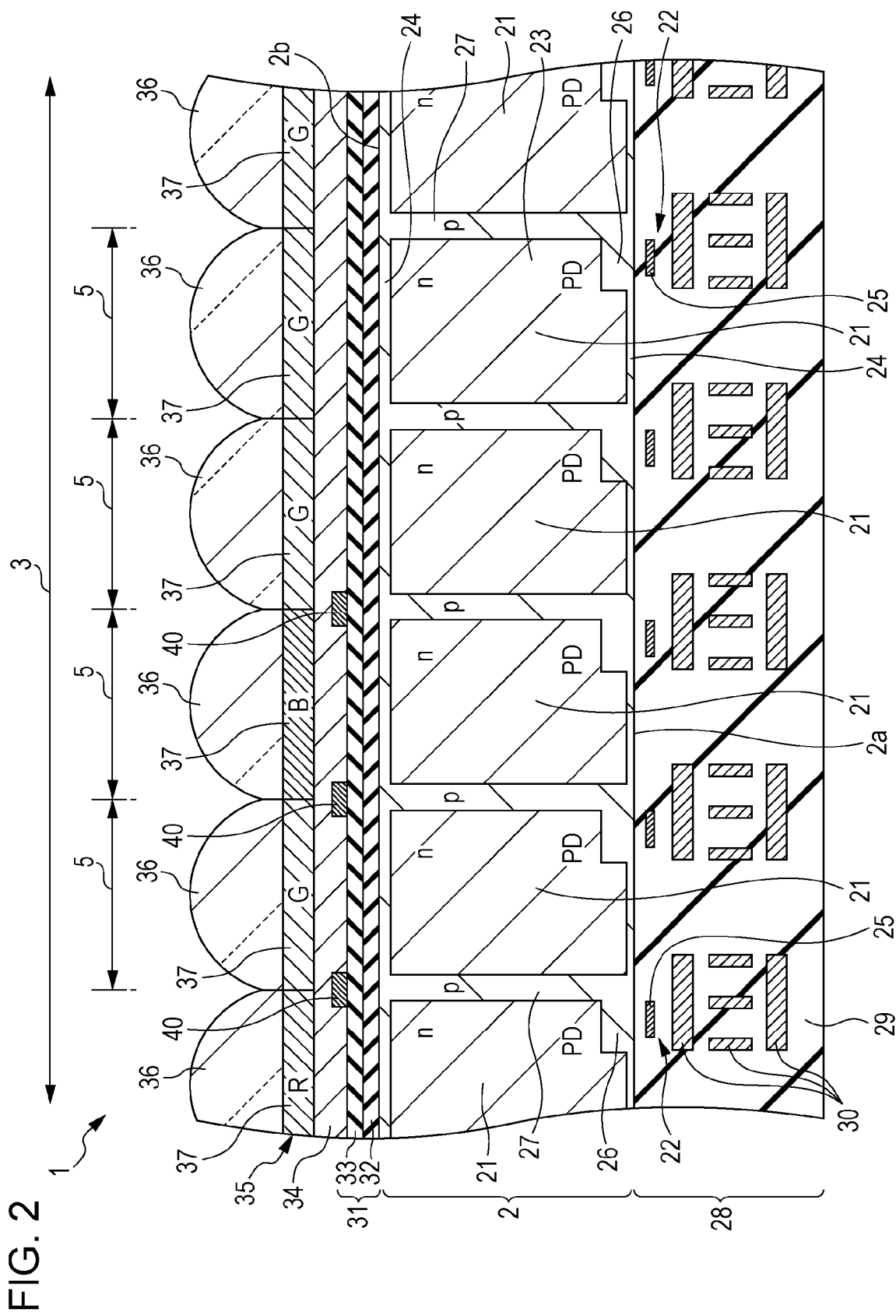
FIG. 2 is a diagram which shows a detailed configuration of the solid-state imaging device according to the first embodiment of the present technology.

Detailed configuration of the solid-state imaging device 1 will be described. The solid-state imaging device 1 is a backside illumination CMOS solid-state imaging device. As shown in FIG. 2, the solid-state imaging device 1 has the pixel region 3 which is provided on the semiconductor substrate 2. The pixel region 3 is a region where the pixels 5 including a photodiode 21 as the photoelectric conversion unit having the photoelectric conversion function are arranged in plural.

The pixel 5 includes the photodiode 21 and the MOS transistor 22. The photodiode 21 is formed in the entire region of the semiconductor substrate 2 in the thickness direction. According to the embodiment, the photodiode 21 includes an n-type semiconductor region 23 as a first conductive type, and a p-type semiconductor region 24 as a second conductive type which is formed so as to face both the front and rear surface sides of the semiconductor substrate 2, and is configured as p-n junction type photodiode. The p-type semiconductor region 24 included in the photodiode 21 serves as a hole charge storage area, as well.

The MOS transistor 22 has a source/drain region (not shown), and a gate electrode 25. The source/drain region of the MOS transistor 22 is formed in a p-type semiconductor well region 26 which is formed on the surface 2a side as one plate surface side of the semiconductor substrate 2, as an n-type region. The gate electrode 25 is formed on the surface 2a of the semiconductor substrate 2 in between both regions of the source/drain region of the MOS transistor 22 through a gate insulation film.

Each of the pixels 5 which is formed of the photodiode 21 and the MOS transistor 22 are separated by an element isolation region 27. The element isolation region 27 is formed as the p-type semiconductor region, and is grounded.

A laminated wiring layer 28 is provided on the surface side 2a of the semiconductor substrate 2. The laminated wiring layer 28 has a plurality of wirings 30 which is laminated through an interlayer insulation film 29. The interlayer insulation film 29 is configured by, for example, a silicon oxide film which is formed of silicon dioxide ($SiO_2$). The plurality of wirings 30 is formed of, for example, different metal, and is connected to each other through a plug or the like which is formed between layers. In addition, according to the embodiment, the wiring layer which is provided on one plate surface side of the semiconductor substrate 2 is the laminated wiring layer 28 having the plurality of wirings, however, the wiring layer is not limited to this, and may be a wiring layer of a single layer structure.

On the other hand, an insulation film 31 which functions as an antireflection film is provided on the rear surface 2b as the other plate surface of the semiconductor substrate 2. The insulation film 31 has a laminated structure in which a plurality of films with different refractivity from each other is laminated. According to the embodiment, the insulation film 31 has a two-layer structure which is formed of a silicon oxide film 32 which is laminated from the semiconductor substrate 2 side, and a hafnium oxide film 33.

In addition, in the pixel region 3, a planarizing film 34 with optical transparency is provided on the insulation film 31. The planarizing film 34 is, for example, formed of an organic material such as resin. A color filter layer 35 is formed on the planarizing film 34. A plurality of micro lenses 36 is formed on the color filter layer 35.

The color filter layer 35 is divided into a plurality of color filters 37 which is provided corresponding to each pixel 5 of the plurality of pixels 5 which is arranged in the pixel region 3. That is, the color filter layer 35 is divided into the plurality of color filters 37 for each photodiode 21 which configures each pixel 5.

In the solid-state imaging device 1 according to the embodiment, each of the color filters 37 is a filter portion of any one of colors of red (R), green (G), and blue (B), and transmits light of each color component. The color filter 37 of each color is so-called an on-chip color filter, and is formed according to the clear bit sequence.

The micro lens 36 is so-called on-chip micro lens, and is formed for each pixel 5 corresponding to the photodiode 21 which configures the pixel 5. Accordingly, the plurality of micro lenses 36 is arranged in a matrix planarly, similarly to the pixel 5. The micro lens 36 condenses light which is input from the outside to the photodiode 21 of the corresponding pixel 5. The micro lens 36 is formed of, for example, the organic material such as resin.

In addition, in the solid-state imaging device 1 according to the embodiment, an inter-pixel light shielding film 40 as an inter-pixel light shielding unit is provided on the pixel boundary in the planarizing film 34 which is formed on the insulation film 31. The inter-pixel light shielding film 40 is a light shielding film which is formed on the insulation film 31 along the boundary line between the pixels 5 adjacent to each other.

That is, the inter-pixel light shielding film 40 is formed as a linear layer portion having a predetermined line width with respect to the pixel 5 with a substantially rectangular shape, along the side of the substantially rectangular shape, when planarly viewed.

The inter-pixel light shielding film 40 is formed of a material which blocks off light. As a material forming the inter-pixel light shielding film 40, it is preferable to use a material with a strong light blocking effect, and is suitable for micromachining, for example, so as to be processed accurately using etching. As the material having such a property, for example, there is metal of aluminum (Al), tungsten (W), copper (Cu), or the like.

The inter-pixel light shielding film 40 is formed on the insulation film 31 using a method including a deposition process for forming film using metal materials of aluminum or the like described above, a mask process which selectively forms a resist mask on the metal layer which is formed using the deposition process, and a removal process for selectively removing the metal layer through the resist mask.

In the deposition process, for example, a spattering method, CVD (Chemical Vapor Deposition) method, plating, or the like are used, and a film (metal layer) is formed using the metal material of the above described aluminum or the like. In the mask process, the resist mask is formed along a portion corresponding to the boundary between the plurality of pixels 5. In the removal process, the metal layer is selectively removed using the etching of wet etching, dry etching, or the like.

As described above, the solid-state imaging device 1 according to the embodiment has a backside illumination structure in which the color filter layer 35 and the micro lens 36 are provided on the rear surface 2b side which is the opposite side to the front surface 2a side on which the laminated wiring layer 28 is provided with respect to the semiconductor substrate 2. That is, in the solid-state imaging device 1, the laminated wiring layer 28 and the color filter layer 35 are provided on the plate surfaces which are different from each other with respect to the semiconductor substrate 2, and the laminated wiring layer 28 is provided on the front surface 2a side which is opposite to the rear surface 2b side to which light is input with respect to the semiconductor substrate 2.

In the backside illumination solid-state imaging device 1, the light which is input from the micro lens 36 side transmits the color filter layer 35, and is received by the photodiode 21 of the pixel 5 without passing through the laminated wiring layer 28. For this reason, in the solid-state imaging device 1, the light which is input from the micro lens 36 side is received by the photodiode 21 of the pixel 5 without being blocked by the laminated wiring layer 28, accordingly, it is easy to secure an actual light receiving area of the photodiode 21, and is able to obtain a relatively high sensitivity, in contrast to a so-called front side illumination structure. In addition, since the laminated wiring layer 28 is provided on the front surface 2a side as the opposite side to the side (the rear surface 2b side) where the light is input with respect to the semiconductor substrate 2, it is possible to obtain high degree of freedom with respect to a layout of the wiring 30 which configures the laminated wiring layer 28.

In addition, the solid-state imaging device 1 according to the embodiment includes the inter-pixel light shielding film 40 as the inter-pixel light shielding unit which is provided at the boundary portion (hereinafter, referred to as "inter-pixel boundary portion") between the pixels 5 adjacent to each other, between the semiconductor substrate 2 and the color filter layer 35. Specifically, the solid-state imaging device 1 has the inter-pixel light shielding film 40 on the insulation film 31 which is provided between the rear surface 2b side of the semiconductor substrate 2 and the color filter layer 35.

In addition, the solid-state imaging device 1 according to the embodiment is the backside illumination, however, the device may be a front side illumination solid-state imaging device in which the laminated wiring layer 28 is provided on the front surface 2a side to which the light is input with respect to the semiconductor substrate 2. When it is the backside illumination structure, the color filter layer 35 and the micro lens 36 are formed on the same side as the laminated wiring layer 28 through the laminated wiring layer 28 which is provided on one side of the semiconductor substrate 2 with respect to the semiconductor substrate 2. In this manner, the laminated wiring layer 28 included in the solid-state imaging device 1 may be provided on any one plate surfaces side of the semiconductor substrate 2.

When the solid-state imaging device 1 has the front side illumination structure, for example, the insulation film such an insulation film 31 is formed on the laminated wiring layer which is provided on one surface side of the semiconductor substrate 2, and the inter-pixel light shielding film 40 is provided on the insulation film. However, in any of the front side illumination and the backside illumination, the position where the inter-pixel light shielding film 40 is provided is not particularly limited, if the position is a portion between the semiconductor substrate 2 and the color filter layer 35 in the solid-state imaging device 1.

Detailed Configuration of Inter-Pixel Light Shielding Film

A configuration of the inter-pixel light shielding film 40 included in the solid-state imaging device 1 according to the embodiment will be described in detail. As described above, in the pixel array, the inter-pixel light shielding film 40 which is provided at the inter-pixel boundary portion is selectively provided on the basis of the relationship of the colors of the color filter 37 (hereinafter, referred to as "color" simply) of a pair of pixels 5 which configures the boundary by being adjacent to each other. That is, the inter-pixel light shielding film 40 is provided at a part of the inter-pixel boundary portion, on the basis of the color combination of the pixels 5 which are adjacent to each other, among all the inter-pixel boundary portions, in the pixel region 3 in which the plurality of pixels 5 are arrayed.

Figure 3:
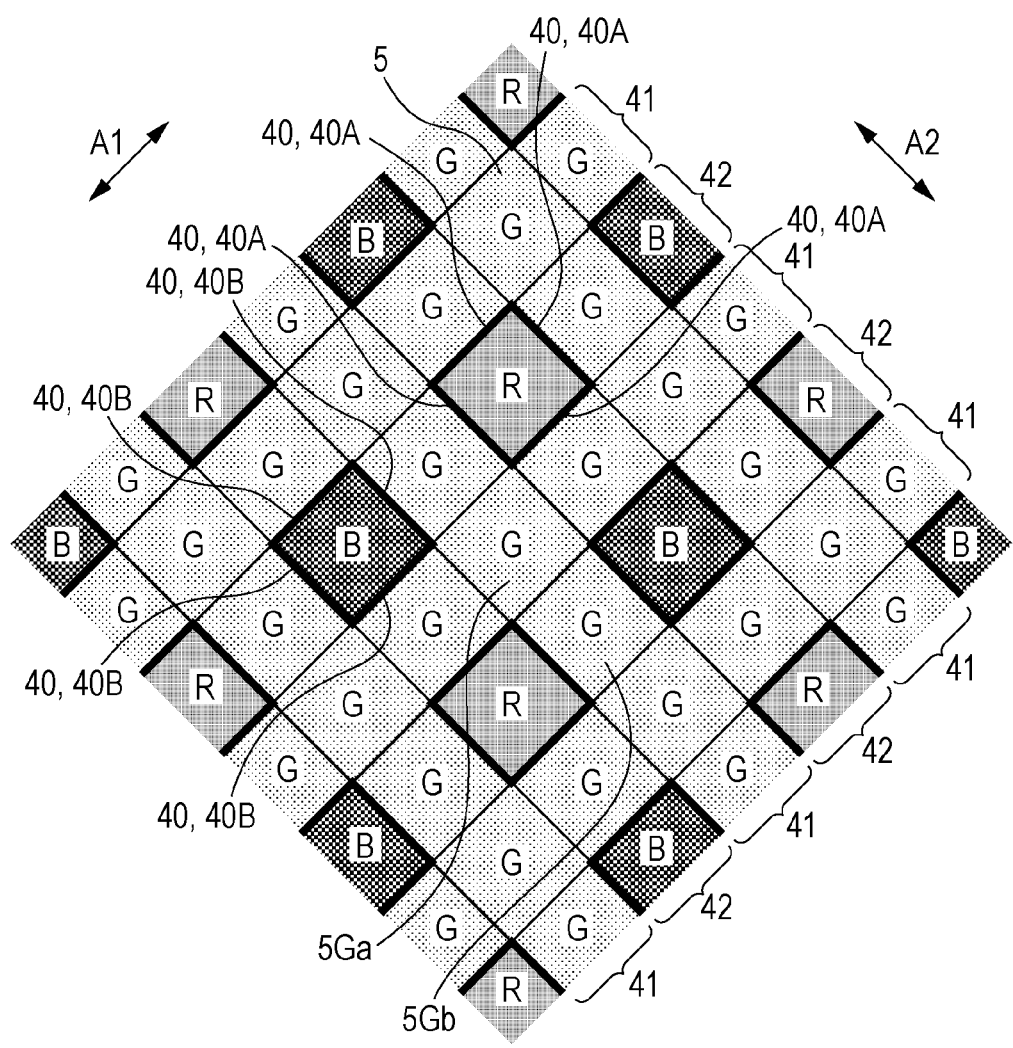
FIG. 3 is a diagram which shows an example of pixel array of the solid-state imaging device according to the first embodiment of the present technology.

Here, the pixel array included in the solid-state imaging device 1 according to the embodiment will be described with reference to FIG. 3. As shown in FIG. 3, the pixel array in the pixel region 3 is the above described clear bit sequence, and is arranged in a diagonal matrix in a state of being diagonal by 45° with respect to the semiconductor substrate 2 having a rectangular shape when planarly viewed. In FIG. 3, red, green, and blue are represented by "R", "G", and "B", respectively, for the color of each of pixels 5.

As shown in FIG. 3, in the clear bit sequence, in each direction of the first direction (refer to arrow A1) and the second direction (refer to arrow A2), pixel columns 41 which are formed only of green (G) pixel 5 (hereinafter, referred to as "G pixel") (hereinafter, referred to as "single color pixel column"), and pixel columns 42 which are formed of three color pixels 5 (hereinafter, referred to as "multicolor pixel column") of red (R) pixel 5 (hereinafter, referred to as "R pixel"), blue (B) pixel 5 (hereinafter, referred to as "B pixel"), and G pixel are alternately arranged. In the multicolor R pixel column 42, the R pixel and the B Pixel are alternately arranged by interposing the G Pixel therebetween.

In this clear bit sequence, as color combinations of pixels 5 which are adjacent to each other, there are a color combination of the pixel 5 in which colors are different from each other, and a color combination of the pixel 5 in which colors are the same as each other.

Specifically, in the clear bit sequence shown in FIG. 3, in each direction of the first direction and the second direction, the combination of the multicolor pixels is formed by any of combinations of the R pixel and G pixel, or the G pixel and B pixel which are adjacent to each other, regarding the pixels 5 configuring the multicolor pixel column 42. In addition, in each direction of the first direction and the second direction, the pixels adjacent to each other forms the same color pixel combination with only the G Pixels, regarding the pixels 5 configuring the single color pixel column 41.

In this manner, in the solid-state imaging device 1 according to the embodiment which adopts the clear bit array as the pixel array, the plurality of pixels 5 has the combination of different color pixels of which colors of the color filter 37 are different from each other, and the combination of the same color pixels of which colors of the color filter 37 are the same as each other, as the pixels 5 adjacent to each other, using the colors of the color filter 37.

Hereinafter, pixels 5 which are adjacent to each other in the combination of the different color pixels are referred to as "inter-pixel of different colors", and the pixels 5 which are adjacent to each other in the combination of the same color pixels are referred to as "inter-pixel of the same colors". That is, in the above described clear bit sequence, as the inter-pixel of different colors, there are inter-pixel of R pixel and G pixel, and the inter-pixel of G pixel and B pixel, and as the inter-pixel of the same colors, there are inter-pixel of G pixels.

In addition, in the solid-state imaging device 1 according to the embodiment, the inter-pixel light shielding film 40 is provided so as to be concentrated at the pixel boundary portion in the different color combination, that is, at the boundary portion between the different color pixels, in the above described clear bit sequence.

That is, in the pixel array as shown in FIG. 3, the inter-pixel light shielding film 40 is intensively provided at the inter-pixel boundary portion between the R pixel and G pixel as the different color pixels from each other, or between the G pixel and B pixel with respect to the inter-pixel boundary portion of Pixel as the same color pixel as each other. In other words, a ratio of presence of the inter-pixel light shielding film 40 is higher at the boundary portion of the different color pixels from each other than the boundary portion of the same pixels as each other. Here, the ratio of presence of the inter-pixel light shielding film 40 means the ratio in the unit of the number of places at the inter-pixel boundary portion where the inter-pixel light shielding film 40 is provided, or the ratio of the area of the inter-pixel light shielding film 40 in each inter-pixel boundary portion.

Specifically, regarding the former ratio, for example, when one hundred places are present for the different color pixels and the same color pixels, respectively, in the entire pixel arrays, the inter-pixel light shielding film 40 is provided at eighty places in one hundred places of the inter-pixel boundary portion at the boundary portion of different color pixels, and the inter-pixel light shielding film 40 is provided at twenty places in one hundred places of the inter-pixel boundary portion at the boundary portion of the same color pixels. In this manner, the inter-pixel light shielding film 40 is provided so that the ratio of presence of the inter-pixel light shielding film 40 is higher at the boundary portion of different color pixels from each other than the boundary portion of the same color pixels as each other.

In addition, regarding the latter ratio, for example, the length or the line width of the inter-pixel light shielding film 40 in each inter-pixel boundary portion is subject to dimensional adjustment, by forming the inter-pixel light shielding film 40 partially, or intermittently with respect to the length of the side of each pixel 5, or by forming the narrow width. In this manner, the area of the inter-pixel light shielding film 40 provided at the boundary portion between the different color pixels is set to be larger than the area of the of the inter-pixel light shielding film 40 provided at the boundary portion between the same color pixels.

Accordingly, as described above, when the ratio of presence of the of the inter-pixel light shielding film 40 is higher at the boundary portion of the different color pixels from each other than the boundary portion of the same pixels as each other, it means that, in the inter-pixel boundary portion in which the inter-pixel light shielding film 40 is present, the boundary portion of the different color pixels from each other is larger than the boundary portion of the same pixels as each other, in the entire pixel array in the pixel region 3.

In this manner, the fact that the inter-pixel light shielding film 40 is further concentrated in between the different color pixels than in between the same color pixels is based on the following fact. That is, in between the different color pixel, it is emphasized to suppress the optical color mixing, and to suppress the decrease in sensitivity which is caused when the light to be sensed by the photodiode 21 configuring the pixel 5 is blocked. This will be described in detail as follows.

Figure 4:
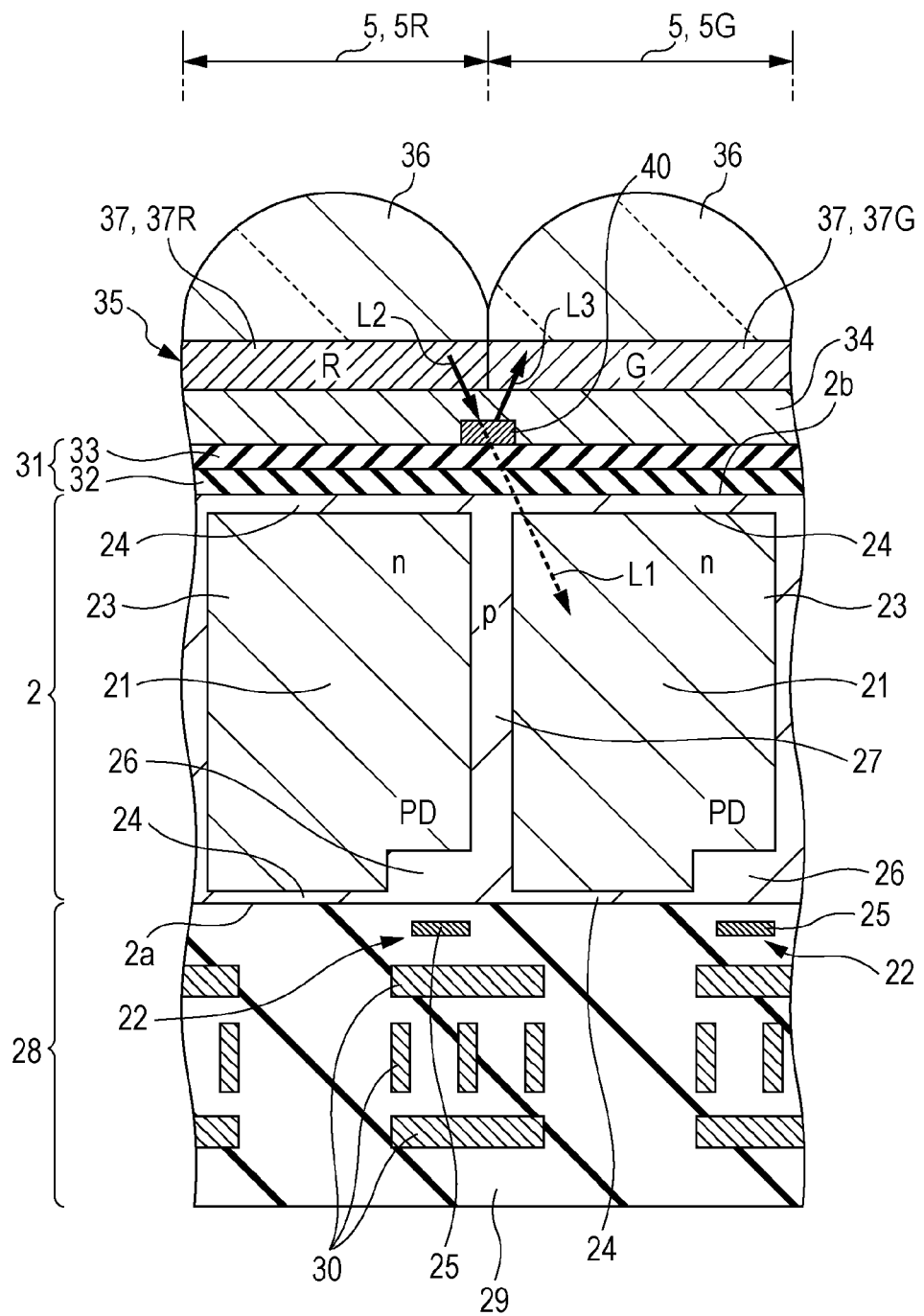
FIG. 4 is an explanatory diagram of an operation of the solid-state imaging device according to the first embodiment of the present technology.

First, a case of inter-pixel of different colors will be described using FIG. 4. In FIG. 4, as an example of a combination of different color pixels, the R pixel 5R and G pixel 5G which are adjacent to each other are exemplified.

The most part of light which is input to the micro lens 36 of the R pixel 5R transmits a red color filter 37R, and is input to the photodiode 21 of the R pixel 5R. On the other hand, oblique light is included in the light which is input to the micro lens 36 of the R pixel 5R, which is not able to be condensed by the micro lens 36, transmits the red color filter 37R, and goes toward the G pixel 5G adjacent to the R pixel 5R, and then is input to the photodiode 21 of the G pixel 5G (refer to dashed arrow L1).

In addition, the most part of the light which is input to the micro lens 36 of the G pixel 5G transmits a green color filter 37G, and in input to the photodiode 21 of the G pixel 5G. Accordingly, as described above, when the light which transmits the red color filter 37R is input to the photodiode 21 of the G pixel 5G as the oblique light, the optical color mixing occurs. That is, since a color of the color filter 37 in which the light input to the photodiode 21 is transmitted, and a color of the color filter 37 which is provided corresponding to the photodiode 21 which receives the light are different from each other, the optical color mixing occurs. In the example shown in FIG. 4, colors of red (R) and green (G) are mixed.

Such a color mixing in between the different color pixels mainly occurs in the vicinity of the boundary portion of the different color pixels from each other, due to the light which obliquely transmits the portion between the color filter 37 and the photodiode 21, and is input to the photodiode 21 of the adjacent pixel 5 from the micro lens 36. Therefore, the optical color mixing is suppressed by the presence of the inter-pixel light shielding film 40 at the boundary portion of the different color pixels from each other.

Specifically, as shown in FIG. 4, for example, in the light which is input to the micro lens 36 of the R pixel 5R, oblique light (the solid arrow L2) goes toward the G pixel 5G adjacent to the R pixel 5R without being condensed by the micro lens 36 is blocked by the inter-pixel light shielding film 40 which is present at the boundary portion of the different color pixels from each other. That is, when the inter-pixel light shielding film 40 is not present, the light (dashed arrow L1) which is input to the photodiode 21 of the G pixel 5G next to the R pixel 5R is input to the inter-pixel light shielding film 40, and is reflected (solid arrows L2 and L3). Due to this, the oblique light which causes the color mixing in between the different color pixels is prevented from inputting to the photodiode 21.

Figure 5:
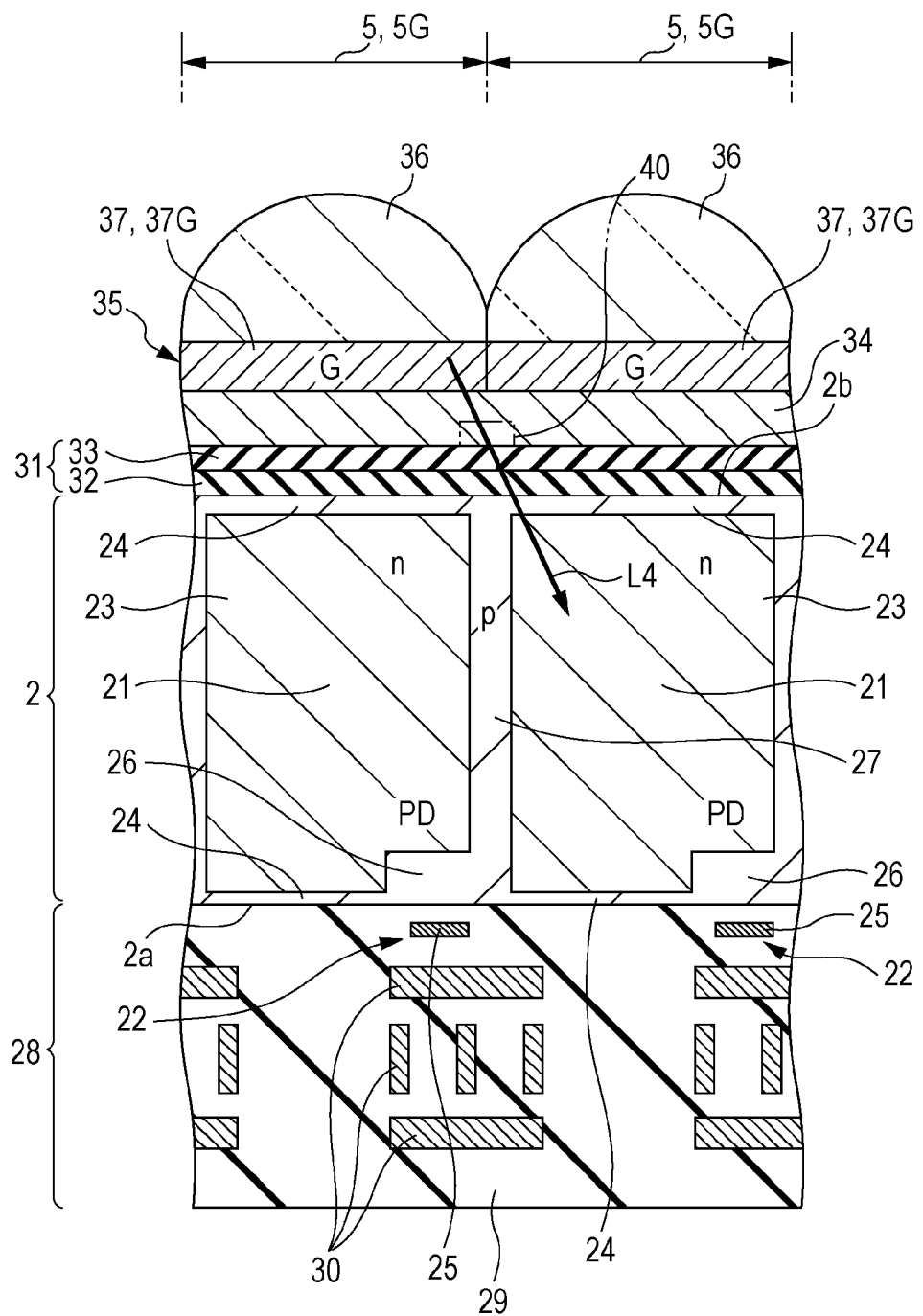
FIG. 5 is an explanatory diagram of the operation of the solid-state imaging device according to the first embodiment of the present technology.

Subsequently, the case of inter-pixels of the same color will be described using FIG. 5. In FIG. 5, as the combination of the same color pixels, two G pixels 5G which are adjacent to each other are shown.

In between the same color pixels, the above described optical color mixing which occurs between the different color pixels does not occur. That is, oblique light is included in the light which is input to the micro lens 36 of the G pixel 5G on one side (the left side in FIG. 5), which is not able to be condensed by the micro lens 36, transmits the green color filter 37G, and goes toward the G pixel 5G on the other side (the right side in FIG. 5) which is adjacent to the G pixel 5G of one side, and then is input to the photodiode 21 of the G pixel 5G on the other side (refer to solid arrow L4).

In addition, the most part of the light which is input to the micro lens 36 of the G pixel 5G on the other side (the right side in FIG. 5) transmits the green color filter 37G corresponding to the micro lens 36 of the G pixel on the other side, and is input to the photodiode 21 of the G pixel 5G on the other side which corresponds to the color filter 37G thereof. Accordingly, as described above, even if the light which transmits the green color filter 37G of the G pixel 5G on one side is input to the photodiode 21 of the G pixel 5G on the other side, the optical color mixing does not occur. That is, since the color of the color filter 37 in which the light input to the photodiode 21, and the color of the color filter 37 which is provided corresponding to the photodiode 21 which receives the light are the same colors, the optical color mixing does not occur.

On the other hand, since the inter-pixel light shielding film 40 which is present at the inter-pixel boundary portion is an object which blocks off light, there is a possibility that the light to be sensed by the photodiode 21 of each pixel 5 is blocked due to the reflection of the input light by the inter-pixel light shielding film 40, as described above. In this manner, the blocking off of light to be sensed by the photodiode 21 of each pixel 5 causes the decrease in sensitivity.

Accordingly, as described above, at the boundary portion in between the same color pixels where the optical color mixing is not a problem, useless blocking of light of input light in between the adjacent pixels is suppressed, and the sensitivity can be improved, by removing or reducing the inter-pixel light shielding film 40 intentionally. In the case of the solid-state imaging device 1 according to the embodiment, it is possible to improve the sensitivity of the G pixel which configures the inter-pixel of the same color pixels.

That is, the fact that the inter-pixel light shielding film 40 is further concentrated in between the different color pixels than in between the same color pixels is based on the view point as follows. That is, in between the different color pixels, the priority is given so as to suppress the optical color mixing due to the inter-pixel light shielding film 40, and to improve the sensitivity due to the absence of the inter-pixel light shielding film 40. Accordingly, it is possible to suppress the Mg flare which occurs during the signal processing due to the optical color mixing, since the optical color mixing is suppressed by the inter-pixel light shielding film 40, in between the different color pixels.

As described above, in the solid-state imaging device 1 according to the embodiment, it is possible to suppress the optical color mixing, or the Mg flare, and to improve the sensitivity.

FIG. 3 shows a case where the inter-pixel light shielding film 40 is provided only at the boundary portion of the different color pixels from each other, as an example of a case where the inter-pixel light shielding film 40 is concentrated at the boundary portion of the different color pixels from each other in contrast to the boundary portion the same color pixels as each other. That is, in the solid-state imaging device 1 according to the embodiment, the inter-pixel light shielding film 40 is present only at the inter-pixel boundary portion in the combination of the different color pixels, without being present at the inter-pixel boundary portion in the combination of the same color pixels. In addition, in FIG. 3, for convenience, the inter-pixel light shielding film 40 which is present between the semiconductor substrate 2 and the color filter 35 is denoted by a thick line which goes along the boundary line between the pixels 5 in the pixel array.

As shown in FIG. 3, in the solid-state imaging device 1, there are inter-pixel light shielding film 40A which is provided at the inter-pixel boundary portion of the R pixel and G pixel as the boundary portion of the different color pixels from each other, and inter-pixel light shielding film 40B which is provided at the inter-pixel boundary portion of the B pixel and G pixel as the boundary portion of the same color pixels as each other, as the inter-pixel light shielding film 40. In addition, in the solid-state imaging device 1, the inter-pixel light shielding film 40 is not provided at the inter-pixel boundary portion in between the same color pixels, that is, the inter-pixel boundary portion between the G pixels.

In the clear bit sequence as the pixel array of the solid-state imaging device 1, by adopting the above described layout of the inter-pixel light shielding film 40, as a result, the four sides of the R pixel are surrounded by the inter-pixel light shielding film 40A, and the four sides of the B pixel are surrounded by the inter-pixel light shielding film 40B with respect to the pixel 5 which is rectangular when planarly viewed, whereby the inter-pixel light shielding film 40 is provided.

Such a selective arrangement of the inter-pixel light shielding film 40 with respect to the boundary portion of each pixel is realized by removing the light shielding film which is present at the boundary portion between the same color pixels, in the method of forming the above described inter-pixel light shielding film 40.

Specifically, in the method of forming the above described inter-pixel light shielding film 40, a resist mask is formed at only the portion corresponding to the boundary portion between the different pixels with respect to a metal layer which is formed using the deposition process. In addition, in the removal process, the boundary portion between the same color R pixel in the metal layer as the inter-pixel light shielding film 40 is removed by etching along with the portion other than the inter-pixel boundary portion. In this manner, the inter-pixel light shielding film 40 is formed at only the boundary portion between the different color pixels.

According to the solid-state imaging device 1 of the embodiment having the above described inter-pixel light shielding film 40, it is possible to reliably obtain the above described effect in which the sensitivity can be improved in between the same color pixels while suppressing the optical color mixing in between the different color pixels.

Here, a shielding effect with respect to the Mg flare in the solid-state imaging device 1 according to the embodiment will be described. The Mg flare occurs as follows. A part of light which is input from the micro lens 36 toward the photodiode 21 of the pixel 5 becomes the light which goes toward the micro lens 36 side from the photodiode 21 side as the reflected light or the diffracted light. This reflected light or the diffracted light passes through the micro lens 36 or the like, is reflected by seal glass or the like which covers the micro lens 36 in a package of the CMOS solid-state imaging device, and is input from the micro lens 36 toward the photodiode 21 side again. In this manner, the light which is input to the photodiode 21 side again causes the optical color mixing, in pixels of each color of, for example, red, green, and blue uniformly, as the reflected light, the diffracted light, or the like.

In addition, in the solid-state imaging device 1, processing which is referred to as white balance processing is performed, in order to align the spectral characteristics of light of each color component. According to the white balance processing, for example, when the color filter layer 35 is divided into three color filters 37 of red, green, and blue, signals of red and blue are emphasized by obtaining larger gain with respect to the green signal. Since such white balance processing is performed in a state where the color mixing occurred in the pixel 5 uniformly, as described above, the Mg flare occurs.

As shown in FIG. 3, when the inter-pixel light shielding film 40 is removed in between the G Pixels as the same color pixels as each other, it means that magenta color is closer to white color. When instinctively viewed, the white flare component also occurs due to the set lens in a camera or the like, however, since the appearance is natural, it is not problematic, and is not considered as a cause of deteriorating the image quality.

In addition, as the pixel array, there is an array in which color pixels other than the G Pixel are adjacent to each other, however, it is possible to obtain an avoidance of the Mg flare by providing an antireflection film, or the like, on the seal glass side which covers the micro lens 36, even when the inter-pixel light shielding film 40 is removed in between the same color pixels in such an array.

Correction of Signal Processing

As shown in FIG. 3, in the clear bit sequence, in a configuration in which the inter-pixel light shielding film 40 is provided only at the boundary portion between the different color pixels, difference in sensitivity occurs between the pixels 5, due to the presence or absence of the inter-pixel light shielding film 40 with respect to the four sides of each pixel 5 which is rectangular when planarly viewed.

Specifically, in a case of the layout of the inter-pixel light shielding film 40 in the clear bit sequence as shown in FIG. 3, there are G pixels 5Ga (hereinafter, referred to as "a first G pixel") where the inter-pixel light shielding film 40 is not present at the inter-pixel boundary portion corresponding to any side of the four sides of the G pixel when planarly viewed, and G pixels 5Gb (hereinafter, referred to as "a second G pixel") where the inter-pixel light shielding film 40 is present only at the inter-pixel boundary portion corresponding to two sides facing each other when planarly viewed. That is, the inter-pixel light shielding film 40 is present at two sides facing each other at the periphery of the second G pixel 5Gb, without being present at the periphery of the first G pixel 5Ga.

The difference in sensitivity occurs in between such first G pixel 5Ga and the second G pixel 5Gb, due to the presence or absence of the inter-pixel light shielding film 40 at the periphery of each pixel 5. That is, even in the same G pixel, the difference in sensitivity occurs due to the light shielding operation of the inter-pixel light shielding film 40, since the light intensity which is received by the photodiode 21 of the pixel 5 is different due to the presence or absence of the inter-pixel light shielding film 40 which is present at the peripheral inter-pixel boundary portion.

In this manner, the difference in sensitivity in between the first G pixel 5Ga and the second G pixel 5Gb occurs between the plurality of pixels 5 due to the amount of the inter-pixel light shielding film 40 at the inter-pixel boundary portion between the pixels 5 at the periphery of each pixel 5Ga and 5Gb. Here, the amount of the inter-pixel light shielding film 40 includes all of quantitative elements of the inter-pixel light shielding film 40 which causes the difference in sensitivity in between the pixels 5, for example, the number of places where the inter-pixel light shielding film 40 is provided at the periphery of each pixel 5 (the number of sides where the inter-pixel light shielding film 40 is provided among four sides in the rectangular pixel 5 when planarly viewed), the length or line width of the inter-pixel light shielding film 40 which is provided at each the inter-pixel boundary portion, that is, the area of the inter-pixel light shielding film 40, or the like.

Therefore, in the solid-state imaging device 1 according to the embodiment, in the process of signal processing in the column processing circuit 7 which is provided at the peripheral circuit region 4, a correction based on the magnitude of the difference in sensitivity between the above described first G pixel 5Ga and the second G pixel 5Gb (hereinafter, referred to as "correction of difference in sensitivity") is performed with respect to the output value of the output signal from each pixel 5. The detailed correction of difference in sensitivity is performed as follows.

According to the embodiment, the sensitivity of the second G pixel 5Gb in which the inter-pixel light shielding film 40 is present at a pair of sides facing each other is low with respect to the first G pixel 5Ga in which the inter-pixel light shielding film 40 is not present in any of the four sides. Here, the difference in sensitivity of the sensitivity S2 (<S1)(%) of the second G pixel 5Gb with respect to the sensitivity S1(%) of the first G pixel 5Ga is set to α(=S1-S2)(%). In addition, the sensitivity in the pixel 5 is a value in proportion to a photoelectric conversion rate which is denoted by the product of the light absorption rate and the light transmittance.

In this manner, when the difference in sensitivity α(%) is present between the first G pixel 5Ga and the second G pixel 5Gb, a correction of increasing the gain of the second G pixel 5Gb of which the sensitivity is low is performed by changing the gain of the signal for each of the pixels 5 according to the value of the sensitivity α(%), in the processing of signal which is output from each pixels 5, using the column signal processing circuit 7. In this case, the correction of difference in sensitivity is performed on the basis of the following expression (1).

$$\beta = \gamma \times (100+\alpha)/100 \qquad (1)$$

here, β is a correction value, and γ is an output value of the output signal from the second G pixel 5Gb.

Accordingly, for example, when the sensitivity of the first G pixel 5Ga is S1=100%, and the sensitivity of the second G pixel 5Gb is S2=90%, α is 10(%). In this case, according to the above expression (1), a value in which the output value γ of the second G pixel 5Gb is multiplied by the value of 1.1 is calculated as the correction value β.

In addition, the case of performing the correction of increasing the gain of the second G pixel 5Gb of which the sensitivity is low between the first G pixel 5Ga and the second G pixel 5Gb was described as an example of the above described correction of difference in sensitivity, however, a correction may be performed in which the gain of the first G pixel 5Ga of which the sensitivity is high is decreased. In this case, the correction of difference in sensitivity is performed on the basis of the following expression (2).

$$\beta = \eta \times (100-\alpha)/100 \qquad (2)$$

here, β is a correction value, and η is an output value of the output signal from the first G pixel 5Ga.

Accordingly, for example, when the sensitivity of the first G pixel 5Ga is S1=100%, and the sensitivity of the second G pixel 5Gb is S2=90%, α is 10(%). In this case, according to the above expression (2), a value in which the output value η of the first G pixel 5Ga is multiplied by the value of 0.9 is calculated as the correction value β.

As described above, in the solid-state imaging device 1 according to the embodiment, the column signal processing circuit 7 corrects the output values (γ and η) of the output signal from each pixel 5 on the basis of the magnitude (α) of the difference in sensitivity occurs between the plurality of pixels 5 due to the difference in the amount of the inter-pixel light shielding film 40 which is present at the periphery of each pixel 5.

In this manner, in the solid-state imaging device 1 according to the embodiment, by performing the correction of difference in sensitivity, it is possible to correct the difference in sensitivity which occurs between the plurality of pixel 5 due to the uneven presence of the inter-pixel light shielding film 40 in the plurality of inter-pixel boundary portions, while improving the sensitivity by suppressing the optical color mixing and the Mg flare. In this manner, it is possible to obtain good sensitivity characteristics.

Second Embodiment

A second embodiment of the present disclosure will be described. In addition, in the embodiment of the present technology to be described in below, the common portion to the above described embodiment will be given the same reference numerals, and the description thereof will be omitted. A solid-state imaging device 51 according to the embodiment includes a light shielding film in a peripheral circuit region 4 which is provided at the periphery of a pixel region 3.

Figure 6:
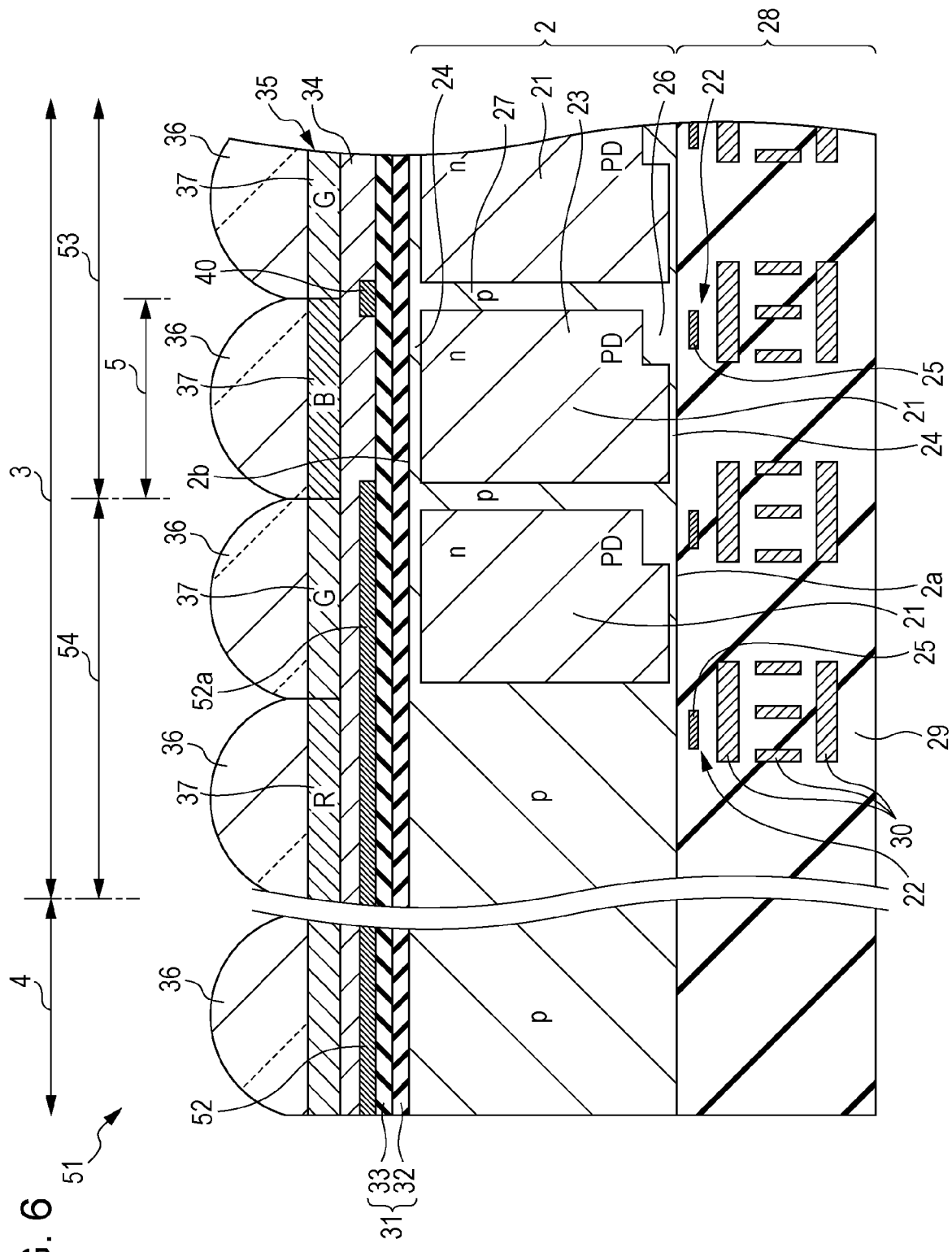
FIG. 6 is a cross-sectional view which shows a configuration of the solid-state imaging device according to a second embodiment of the present technology.

As shown in FIG. 6, the solid-state imaging device 51 according to the embodiment includes a peripheral light shielding film 52 as the light shielding film which is provided in the peripheral circuit region 4. The peripheral light shielding film 52 is formed as the same layer structure as the inter-pixel light shielding film 40 which is included in the solid-state imaging device 51. That is, the peripheral light shielding film 52 is the same layer as that of the inter-pixel light shielding film 40, and is provided in the peripheral circuit region 4 in between the semiconductor substrate 2 and the color filter 35.

In addition, the inter-pixel light shielding film 40 and the peripheral light shielding film 52 are formed at the same time using the same film of the same material. Accordingly, the material which forms the peripheral light shielding film 52 is metal such as, for example, aluminum (Al), tungsten (W), copper (Cu), or the like.

As shown in FIG. 6, the pixel region 3 included in the solid-state imaging device 51 has an effective pixel region 53 and an optical black level region 54. The effective pixel region 53 is a region where a generation, an amplification, and reading out of a signal charge is performed using photoelectric conversion in each pixel 5. The optical black level region 54 is a region where optical black as the reference of a black level is output. The optical black level region 54 is formed at the periphery of the effective pixel region 53.

According to the embodiment, a peripheral light shielding film 52 which is provided in a peripheral circuit region 4 forms a continuous integral light shielding film along with a light shielding film 52a which is provided in the optical black level region 54.

In the peripheral circuit region 4, similarly to the pixel region 3, a laminated wiring layer 28 is provided on the surface 2a side of a semiconductor substrate 2, and an insulation layer 31 and a planarization film 34 are provided on the rear surface 2b side of the semiconductor substrate 2. In addition, a color filter layer 35 is provided on planarization film 34, and a micro lens 36 is formed on the color filter layer 35.

In addition, in the optical black level region 54 which is provided at the periphery portion of the pixel region 3, the light shielding film 52a is provided on the insulation film 31. Further, in the peripheral circuit region 4, which is position at the periphery of the optical black level region 54, a peripheral light shielding film 52 which is continuous to the light shielding film 52a is provided on the insulation film 31.

In a deposition process which is a method of forming the above described inter-pixel light shielding film 40, a metal layer which is the inter-pixel light shielding film 40 is formed in the peripheral circuit region 4, in order to provide the peripheral light shielding film 52 which is provided in the peripheral circuit region 4. In addition, in a mask process, a resist mask is formed at a portion corresponding to a position where the peripheral light shielding film 52 and the light shielding film 52a are provided, in addition to a portion as the inter-pixel light shielding film 40, with respect to the metal layer which is formed by the deposition processing. In this manner, the peripheral light shielding film 52 and the light shielding film 52a are formed through a removal process.

In the solid-state imaging device 51 according to the embodiment, a level difference due to the inter-pixel light shielding film 40 in between the pixel region 3 and the peripheral circuit region 4 is reduced, by providing the peripheral light shielding film 52 which has the same layer structure as that of the inter-pixel light shielding film 40 which is provided in the pixel region 3, in the peripheral circuit region 4 which is provided at the periphery of the pixel region 3. In this manner, according to the solid-state imaging device 51 of the embodiment, it is possible to reduce uneven sensitivity, and to obtain uniform optical characteristics in the pixel region 3, in addition to the effect which is obtained in the solid-state imaging device 1 according to the first embodiment.

Specifically, when a layer structure corresponding to the inter-pixel light shielding film 40 of the pixel region 3, such a peripheral light shielding film 52 is provided in the peripheral circuit region 4, a level difference may occur between the pixel region 3 and the peripheral circuit region 4 depending on the presence or absence of the layer structure corresponding to the inter-pixel light shielding film 40. The level difference between the regions causes difference in height of a lens surface of the micro lens 36 between the center portion of the effective pixel region 53 of the pixel region 3 and the peripheral portion thereof.

Such a difference in height of the lens surface of the micro lens 36 in the effective pixel region 53 causes the uneven sensitivity by making the condensed state due to the micro lens 36 ununiform. Specifically, the brightness of the peripheral portion of the effective pixel region 53 becomes dark with respect to the brightness at the center portion thereof, in the same region.

Accordingly, like the solid-state imaging device 51 according to the embodiment, in the peripheral circuit region 4, it is possible to reduce the level difference between the pixel region 3 and the peripheral circuit region 4 by providing the peripheral light shielding film 52 which has the same layer structure as that of the inter-pixel light shielding film 40 of the pixel region 3. In this manner, it is possible to reduce the difference in height of the lens surface of the micro lens 36 between the center portion and the peripheral portion of the effective pixel region 53 of the pixel region 3. As a result, the uniform condensed state due to the micro lens 36 can be obtained in the effective pixel region 53, and it is possible to suppress the uneven sensitivity, and to improve the image quality.

In this manner, when it is considered to reduce the level difference between the pixel region 3 and the peripheral circuit region 4, like the peripheral light shielding film 52a in the solid-state imaging device 51 according to the embodiment, it is preferable to provide the light shielding film with the same layer as that of the inter-pixel light shielding film 40, even in the optical black level region 54 of the pixel region 3. It is possible to effectively reduce the level difference between the pixel region 3 and the peripheral circuit region 4 due to the presence of the light shielding film with the same layer as that of the inter-pixel light shielding film 40, even in the optical black level region 54. However, the light shielding film with the same layer as that of the inter-pixel light shielding film 40 may be provided only in the peripheral circuit region 4, without being provided in the optical black level region 54 as the peripheral light shielding film 52.

Third Embodiment

A third embodiment of the present disclosure will be described. In a solid-state imaging device 61 according to the embodiment, an inter-pixel light shielding film 40 is connected to a ground area (GND area) of a semiconductor substrate 2.

Figure 7:
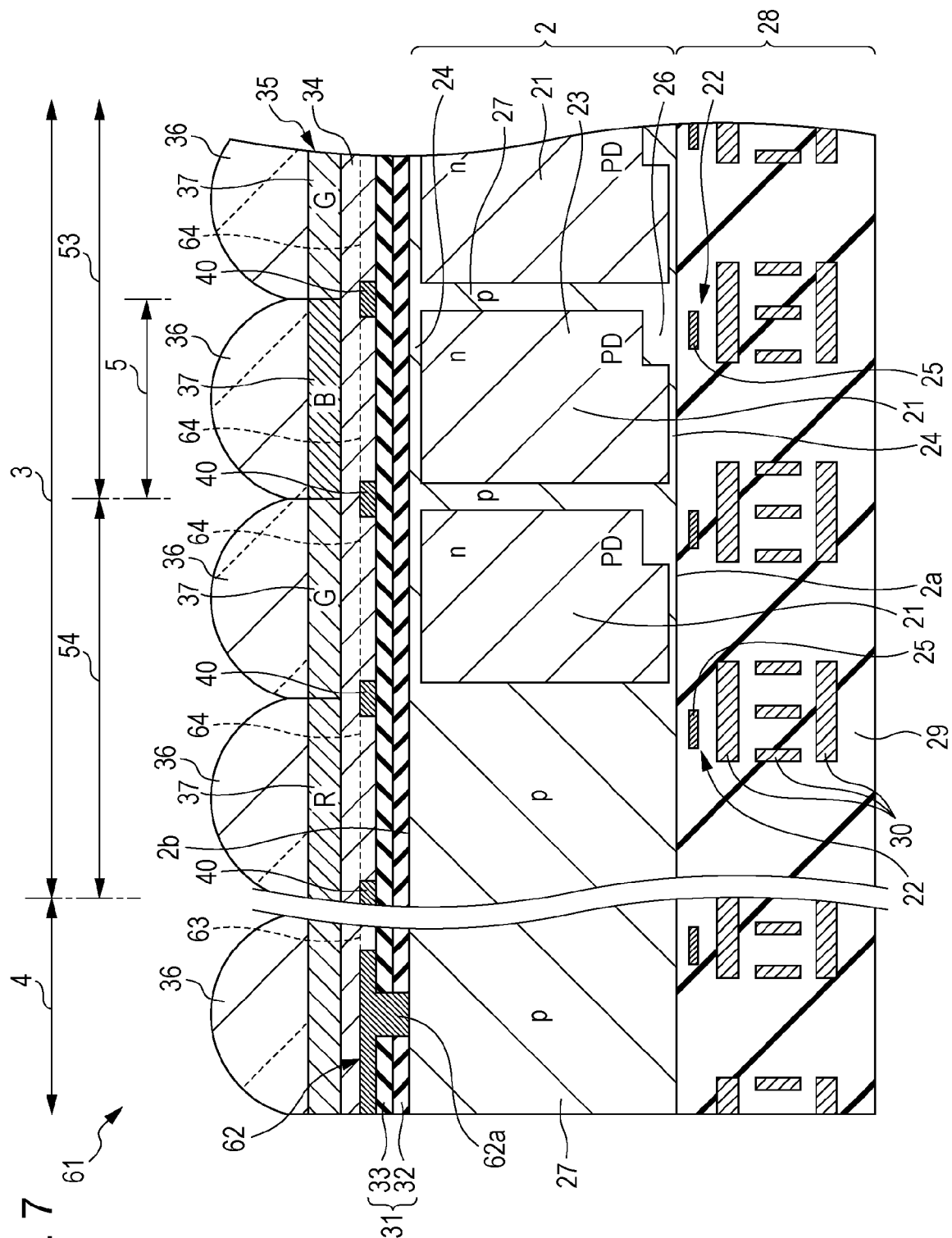
FIG. 7 is a cross-sectional view which shows a configuration of the solid-state imaging device according to a third embodiment of the present technology.

As shown in FIG. 7, in the solid-state imaging device 61 according to the embodiment, a plurality of inter-pixel light shielding films 40 is connected to an element isolation region 27 as a p-type semiconductor as the ground area of a semiconductor substrate 2 through a peripheral light shielding film 62 which is provided in a peripheral circuit region 4, and is grounded. The peripheral light shielding film 62 is formed together with the inter-pixel light shielding film 40 at the same time, using film of the same material. Accordingly, a material forming the peripheral light shielding film 62 is metal, for example, such as aluminum (Al), tungsten (W), copper (Cu), or the like.

The peripheral light shielding film 62 has a contact unit 62a for electrical connection to the element separation unit 27 of the peripheral circuit region 4. That is, the peripheral light shielding film 62 is connected to the element separation unit 27 through the contact portion 62a.

The contact portion 62a is provided so as to protrude to the semiconductor substrate 2 side (lower side in FIG. 7) from the peripheral light shielding film 62. The contact unit 62a is a portion which is integrally formed together with the peripheral light shielding film 62 using the same material as that of the peripheral light shielding film 62, and is extended to the semiconductor substrate 2 side of the peripheral light shielding film 62. The contact unit 62a perforates silicon oxide film 32 and hafnium oxide film 33 which configure an insulation film 31, and is electrically connected to the element separation unit 27 from the rear surface 2b side of the semiconductor substrate 2.

The plurality of inter-pixel light shielding film 40 is grounded to the ground area of the semiconductor substrate 2 through the peripheral light shielding film 62 which is provided in the peripheral circuit region 4. For this reason, the solid-state imaging device 61 according to the embodiment includes a first connection light shielding film 63 which connects the inter-pixel light shielding film 40 to the peripheral light shielding film 62, and a second connection light shielding film 64 which connects between the inter-pixel light shielding films 40 which are present at each of the inter-pixel boundary portions in the pixel region 3.

As shown in FIG. 7, the first connection light shielding film 63 and the second connection light shielding film 64 are formed as the same layer structure as that of the inter-pixel light shielding film 40 which is included in the solid-state imaging device 61. In addition, the first connection light shielding film 63 and the second connection light shielding film 64, and the inter-pixel light shielding film 40 are formed at the same time, and using film of the same material. Accordingly, the material forming the first connection light shielding film 63 and the second connection light shielding film 64 is metal, for example, such as aluminum (Al), tungsten (W), copper (Cu), or the like.

Figure 8:
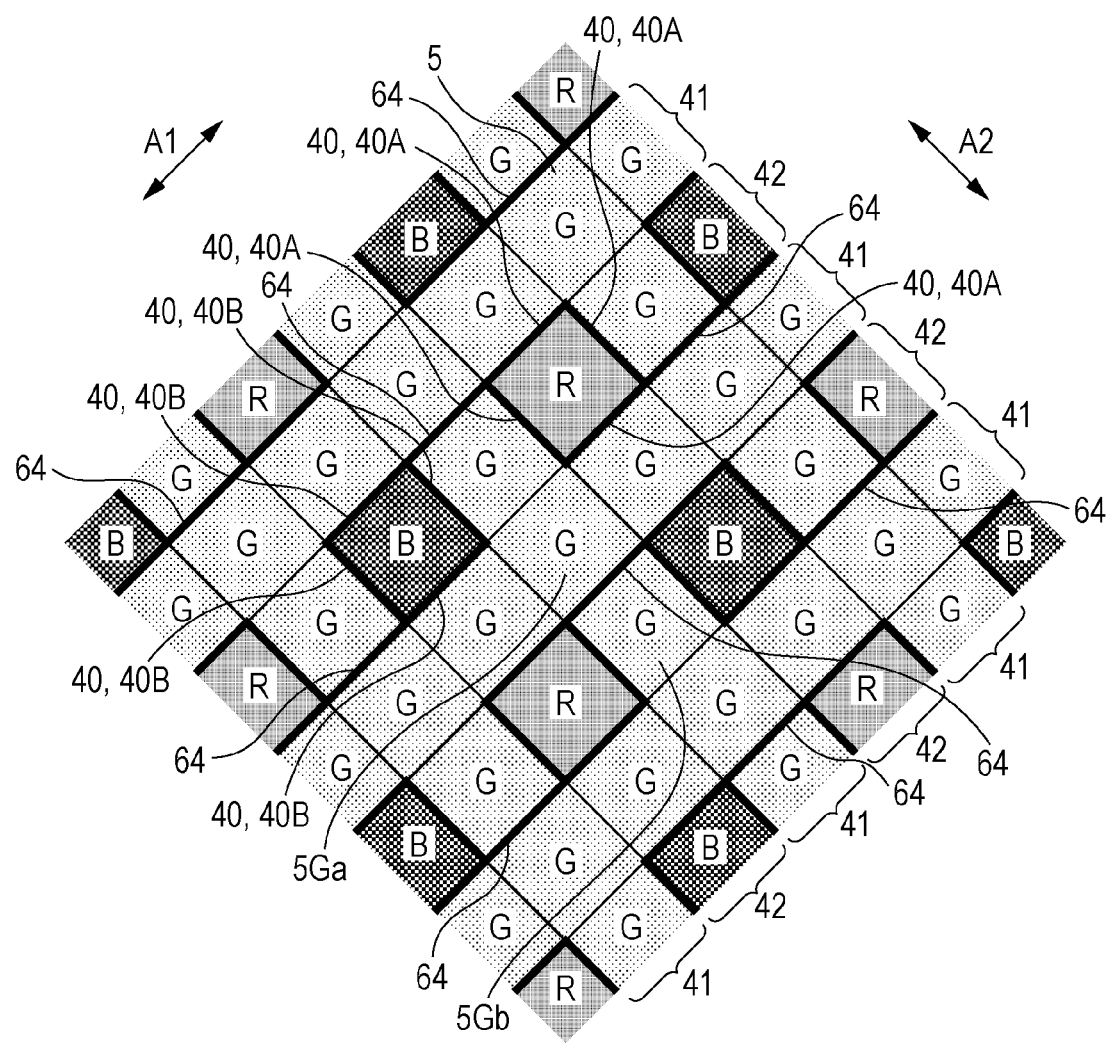
FIG. 8 is a plan view which shows a configuration of the solid-state imaging device according to the third embodiment of the present technology.

As shown in FIG. 8, the second connection light shielding film 64 is provided at the inter-pixel boundary portion, similarly to the inter-pixel light shielding film 40. That is, the second connection light shielding film 64 is formed as a linear layer portion with a predetermined line width so as to go along the substantially rectangular side with respect to the pixel 5 with substantially rectangular shape, when planarly viewed.

The second connection light shielding film 64 is provided at the boundary portion between G pixels as the same color pixels, and electrically connects groups of inter-pixel light shielding film 40 which surrounds four sides of the R pixel and B pixel, respectively, in the above described layout of the inter-pixel light shielding film 40. In addition, the inter-pixel light shielding film 40 (40A and 40B) which surround respective four sides of the R pixel and B pixel are integrally continuous portions, and are electrically connected.

In the example shown in FIG. 8, the second connection light shielding film 64 is alternately arranged with respect to the second direction (refer to arrow A2) for each R pixel, or B pixel, in multi-colored pixel column 42 which are arranged along the first direction (refer to arrow A1), and connects the inter-pixel light shielding film 40 groups which surround respective four sides of the R pixel and B pixel to each other. That is, the second connection light shielding film 64 is provided at the inter-pixel boundary portion on one side with respect to the second direction in between the R pixel and B pixel through one G pixel toward a predetermined direction (for example, up-right on the diagonally right in FIG. 8) in the first direction, in the multi-colored pixel column 42 which are arranged along the first direction, is provided at the inter-pixel boundary portion on the other side with respect to the second direction in between the B pixel and R pixel through one G pixel, and is alternately arranged between each of B pixel and R pixel with respect to the second direction.

In this manner, the group of the inter-pixel light shielding films 40 which are electrically connected to each other by the second connection light shielding film 64 are electrically connected to the peripheral light shielding film 62 which is grounded to the ground area of the semiconductor substrate 2, by the first connection light shielding film 63 (refer to FIG. 7). Due to this, the inter-pixel light shielding film 40 which is included in the solid-state imaging device 61 is grounded to the ground area of the semiconductor substrate 2 through the peripheral light shielding film 62.

In addition, the layouts of the first connection light shielding film 63 for grounding the inter-pixel light shielding film 40 which is included in the solid-state imaging device 61 to the ground area of the semiconductor substrate 2, and the second connection light shielding film 64 are not particularly limited. Accordingly, the arrangement of the second connection light shielding film 64 may be, for example, the arrangement shown in FIG. 9.

Figure 9:
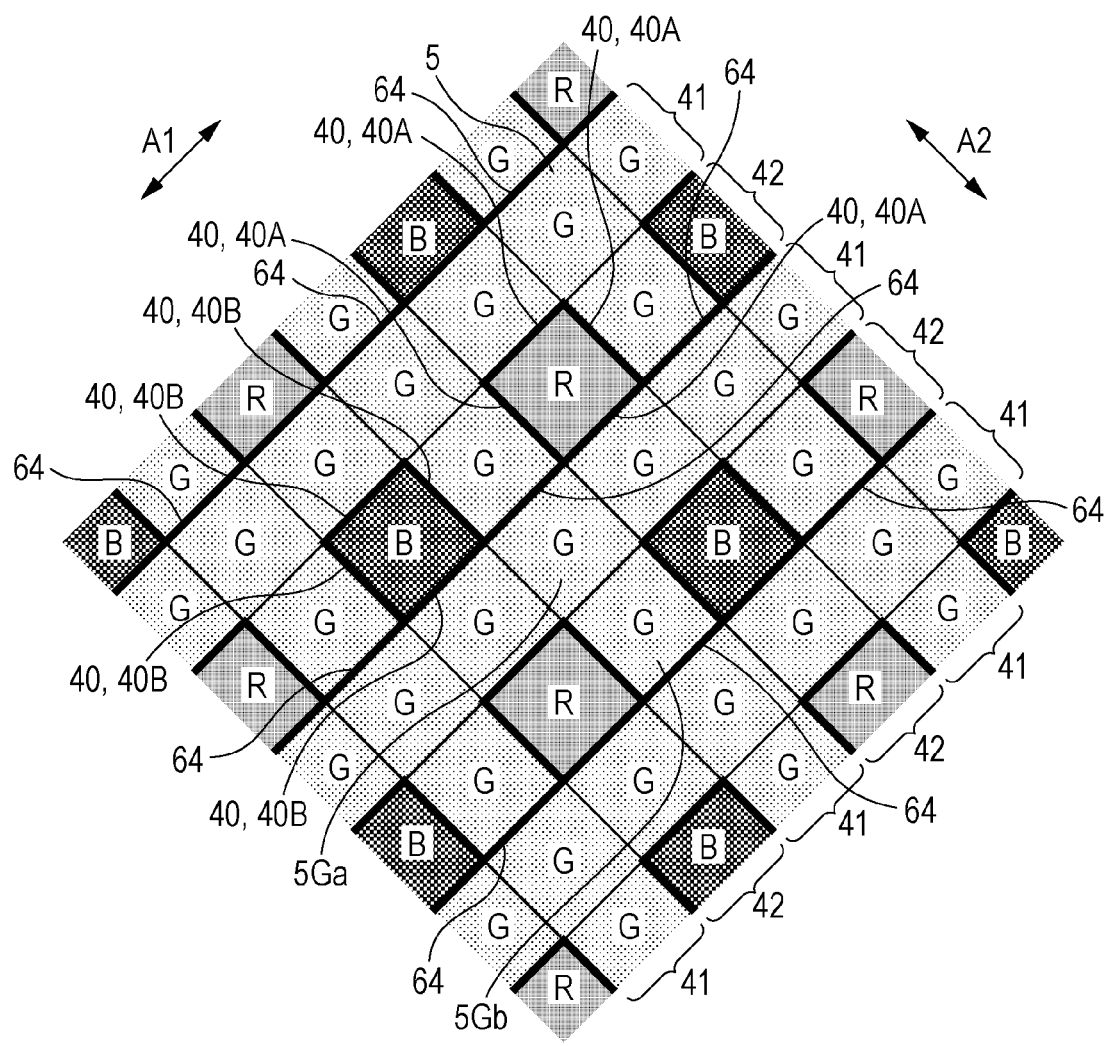
FIG. 9 is a plan view which shows the configuration of the solid-state imaging device according to the third embodiment of the present technology.

In the example shown in FIG. 9, the second connection light shielding film 64 is arranged on the same side as the second direction (refer to arrow A2) for each of R pixel, or B pixel, in the multi-colored pixel column 42 which is arranged along the first direction (refer to arrow A1), and connects the group of inter-pixel light shielding film 40 which respectively surround four sides of the R pixel and B pixel to each other. That is, in the example shown in FIG. 9, the second connection light shielding film 64 is provided at the inter-pixel boundary portion on the same side with respect to the second direction along the first direction, in the multi-colored pixel column 42 which is arranged along the first direction.

In the example shown in FIG. 9, the second connection light shielding film 64 is provided at the inter-pixel boundary portion which corresponds to the lower side on the diagonally right of the G pixel of the multi-colored pixel column 42 which is arranged along the first direction, however, the second connection light shielding film may be provided at the opposite side thereof, that is, the inter-pixel boundary portion which corresponds to the upper side on the diagonally left of the G pixel of the multi-colored pixel column 42 which is arranged along the first direction.

In order to provide the first connection light shielding film 63 and the second connection light shielding film 64, a resist mask is formed at a portion corresponding to a position where the first connection light shielding film 63 and the second connection light shielding film 64 are provided, in addition to the portion as the inter-pixel light shielding film 40, with respect to the metal layer which is formed by the deposition process, in the above described mask process of a method for forming the inter-pixel light shielding film 40. In this manner, the first connection light shielding film 63 and the second connection light shielding film 64 are formed by going through the removal process.

In this manner, in the solid-state imaging device 61 according to the embodiment, the plurality of inter-pixel light shielding film 40 which is provided in the pixel region 3 is electrically connected to each other by the second connection light shielding film 64, and is electrically connected to the peripheral light shielding film 62 which is grounded to the ground area, by the first connection light shielding film 63. Due to this, the inter-pixel light shielding film 40 which is provided in the pixel region 3 is connected to the ground area of the semiconductor substrate 2. In addition, a ground potential is applied to the inter-pixel light shielding film 40 through the element isolation region 27.

According to the solid-state imaging device 61 of the embodiment, in addition to the effects which are obtained in the first and second embodiments, it is possible to prevent the inter-pixel light shielding film 40 from being damaged due to an influence of a plasma treatment or the like, in the processing process of the solid-state imaging device 61, since the inter-pixel light shielding film 40 is grounded.

In the processing process of the solid-state imaging device 61, for example, there may be a case where etching in the removal process for forming the inter-pixel light shielding film 40, or plasma etching which is one of dry etching, as etching for forming the micro lens 36 are performed. The plasma etching causes etching by the action of plasma during discharge, by performing the plasma treatment.

When such a plasma etching is performed, in a case where the inter-pixel light shielding film 40 is in a state of electrically floated without being grounded, it is considered that the inter-pixel light shielding film 40 is damaged due to the plasma treatment. Therefore, as in the solid-state imaging device 61 according to the embodiment, it is possible to avoid the damage due to the plasma treatment or the like in the processing process of the solid-state imaging device 61, by causing the inter-pixel light shielding film 40 to be grounded in the ground area of the semiconductor substrate 2, using the first connection light shielding film 63 and the second connection light shielding film 64 which are guided to the boundary portion between the same color pixels.

In addition, in the solid-state imaging device 61 according to the embodiment, the inter-pixel light shielding film 40 is grounded in the element isolation region 27 as the ground area of the semiconductor substrate 2 passing through the peripheral light shielding film 62 which is provided at the peripheral circuit region 4, however, the inter-pixel light shielding film may be grounded in the element isolation region 27, in the pixel region 3. However, in this case, when considering that the damage to the semiconductor substrate 2 can be suppressed by forming a contact portion such as the contact unit 62a in the peripheral circuit region 4, in the effective pixel region 53, it is preferable that the inter-pixel light shielding film 40 be grounded in the element isolation region 27, in the optical black level region 54 of the pixel region 3. Incidentally, the damage to the semiconductor substrate 2 in this case may cause occurrence of white spot.

In addition, in order to avoid the damage to the inter-pixel light shielding film 40 due to the above described plasma treatment or the like, the inter-pixel light shielding film 40 may be connected to a portion where the potential is constant, that is, to a fixed potential including a ground potential, a supply potential, or the like, without being limited to the ground with respect to the element isolation region 27 as the ground area of the semiconductor substrate 2. In the solid-state imaging device 61, as the fixed potential other than the element isolation region 27, there are, for example, fixed potentials of a value of 0 V, 1.0 V, 2.5 V, 3.3 V, 5 V, or the like, the ground potential, the supply potential, or the like.

In addition, according to the solid-state imaging device 61 of the embodiment, it is possible to reduce the adverse effect such as dark noise or the like which is given to the photodiode 21 in immediate below by the presence of the inter-pixel light shielding film 40, since the potential of the inter-pixel light shielding film 40 is fixed.

In the solid-state imaging device 61 according to the embodiment, the second connection light shielding film 64 which connects between the inter-pixel light shielding film 40, is the same as the inter-pixel light shielding film 40, in practice. That is, the second connection light shielding film 64 is the inter-pixel light shielding film 40 which is present at the boundary portion between the same color pixels. In this regard, in the solid-state imaging device 61 according to the embodiment, the inter-pixel light shielding film 40 is layout so as to be largely provided at the boundary portion between the different color pixels with respect to the inter-pixel light shielding film 40 as the second connection light shielding film 64 which is provided at the boundary portion between the same color pixels, since the guided amount of the second connection light shielding film 64 is suppressed as much as possible.

Fourth Embodiment

A fourth embodiment of the present disclosure will be described. A solid-state imaging device according to the embodiment includes a transparent electrode 72 instead of the second connection light shielding film 64 which electrically connects the inter-pixel light shielding film 40 which is provided at the boundary portion between the different color pixels to each other, when compared to the solid-state imaging device 61 according to the third embodiment.

Figure 10:
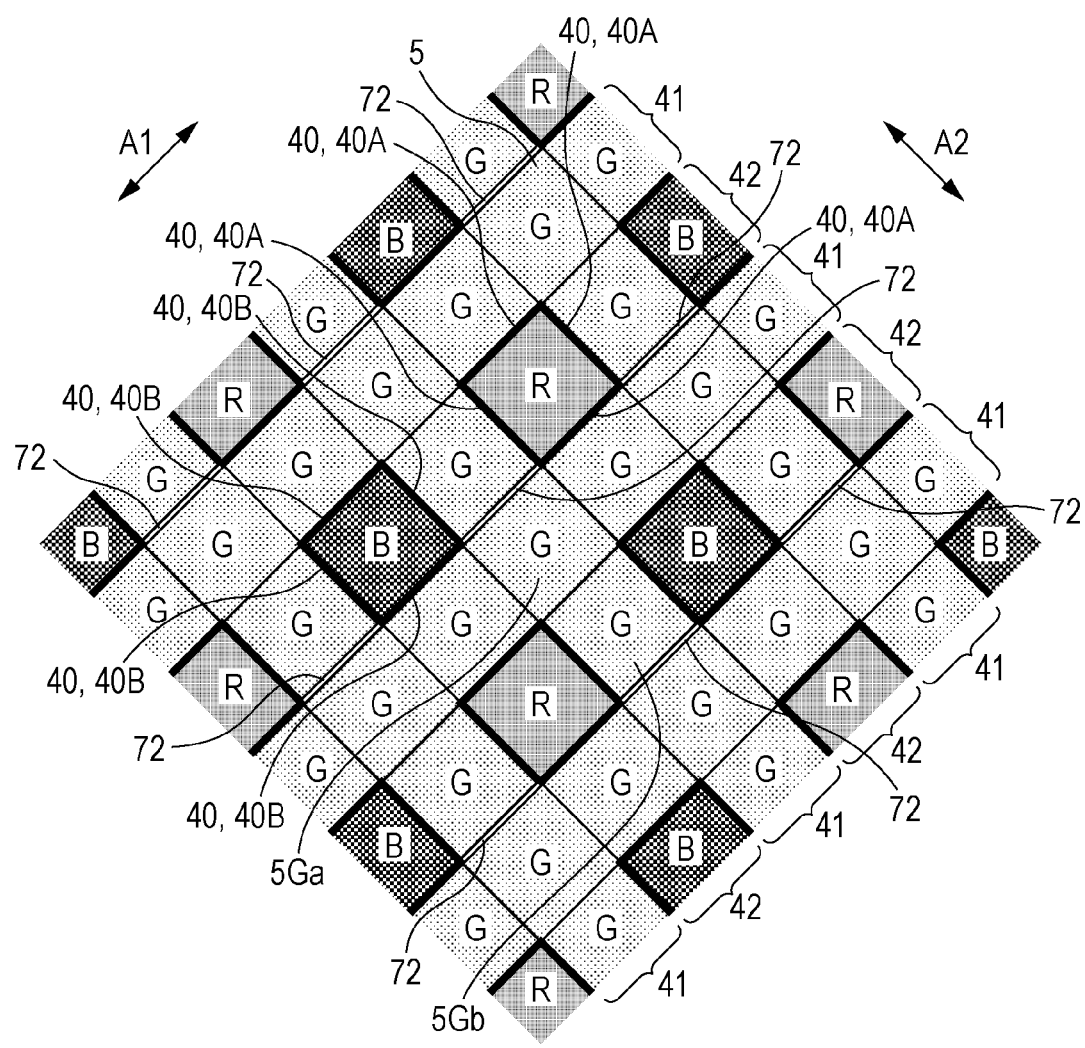
FIG. 10 is a plan view which shows a configuration of the solid-state imaging device according to a fourth embodiment of the present technology.

As shown in FIG. 10, the transparent electrode 72 is formed as a linear layer portion having a predetermined line width so as to be arranged along the side of a substantially square shape with respect to the pixel 5 which is substantially square, when planarly viewed. As shown in FIG. 10, the transparent electrode 72 is provided in the same arrangement as that of the second connection light shielding film 64 which is shown in FIG. 9.

That is, in the example shown in FIG. 10, the transparent electrode 72 is arranged on the same side with respect to the second direction (refer to arrow A2) for each R pixel, or B pixel, in the multi-colored pixel column 42 which is arranged along the first direction (refer to arrow A1), and connects between the inter-pixel light shielding film 40 which surrounds respective four sides of the R pixel and B pixel. That is, in the example shown in FIG. 10, the transparent electrode 72 is provided at the inter-pixel boundary portion on the same side with respect to the second direction, along the first direction, in the multi-colored pixel column 42 which is arranged along the first direction.

In addition, the layout of the transparent electrode 72 which electrically connects the plurality of inter-pixel light shielding film 40 which is included in the solid-state imaging device according to the embodiment to each other is not particularly limited, similarly to the second connection light shielding film 64 according to the third embodiment. Accordingly, in the layout of the transparent electrode 72, for example, as shown in the example in FIG. 10, the transparent electrode 72 may be provided at the inter-pixel boundary portion which corresponds to the upper side on the diagonally left of the G pixel of the multi-colored pixel column 42 which is arranged along the first direction, or may have the same layout as that of the second connection light shielding film 64 shown in FIG. 8.

The transparent electrode 72 is provided, for example, in the same layer position as that of the inter-pixel light shielding film 40. In this case, the transparent electrode 72 is provided on the insulation film 31, similarly to the inter-pixel light shielding film 40. The layer position of the transparent electrode 72 is not particularly limited, however, is provided at a position where the plurality of inter-pixel light shielding film 40 can be electrically connected to each other in between the semiconductor substrate 2 and the color filter layer 35, similarly to the inter-pixel light shielding film 40. In addition, in FIG. 10, the transparent electrode 72 which is present between the semiconductor substrate 2 and the color filter layer 35 is shown as a linear portion which is arranged along the boundary line in the pixel array, for convenience.

The transparent electrode 72 is configured by, for example, a material which is optically transparent, and is conductive, such as indium tin oxide (ITO), a material in which aluminum oxide or gallium oxide is added to zinc oxide, a material in which antimony oxide or fluorine is doped to tin oxide, or the like. However, the material which configures the transparent electrode 72 is not particularly limited, if the material is a conductor with optical transparency.

In this manner, in the solid-state imaging device according to the embodiment, the plurality of inter-pixel light shielding films 40 which is present at the inter-pixel boundary portion in the plurality of pixels 5 are electrically connected to each other by the transparent electrode 72. In addition, the plurality of inter-pixel light shielding film 40 which are electrically connected to each other by the transparent electrode 72 is connected to the fixed potential such as the element isolation region 27 or the like as the ground area of the semiconductor substrate 2, similarly to the case of the third embodiment.

In the solid-state imaging device according to the embodiment, in addition to the effects which are obtained in the first to third embodiments, it is possible to suppress so-call optical vignetting which occurs due to the presence of the inter-pixel light shielding film 40 in the R pixel range 3, and to improve the optical characteristics. That is, it is possible to minimize an optical loss, and to prevent deterioration of the optical characteristics, since blocking of light which is input is prevented in the inter-pixel boundary portion at which the transparent electrode 72 is provided, by providing the transparent electrode 72 instead of the second connection light shielding film 64 with light blocking property, similarly to the inter-pixel light shielding film 40.

Fifth Embodiment

A fifth embodiment of the present disclosure will be described. A solid-state imaging device 81 according to the embodiment is a front side illumination CMOS solid-state imaging device, in contrast to the backside illumination solid-state imaging devices according to the first to fourth embodiments. The solid-state imaging device 81 has a pixel region 3 which is provided in a semiconductor substrate 2. The pixel region 3 is a region where a plurality of pixels 5 including a photodiode 21 as a photoelectric conversion unit with a photoelectric conversion function is arrayed.

Figure 11:
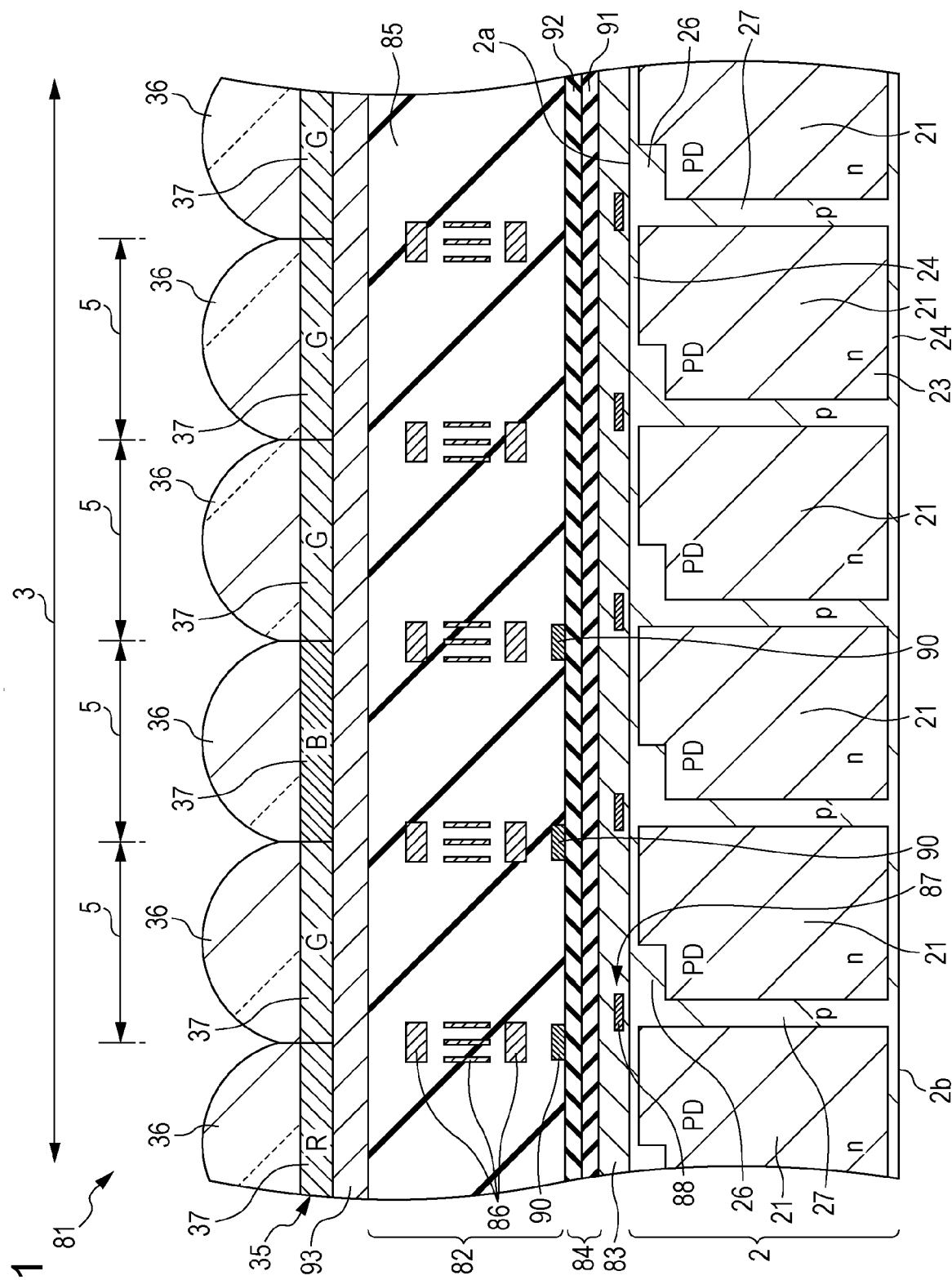
FIG. 11 is a cross-sectional view which shows a configuration of the solid-state imaging device according to a fifth embodiment of the present technology.

As shown in FIG. 11, in the front side illumination solid-state imaging device 81, a laminated wiring layer 82 is provided on the front surface 2a side of the semiconductor substrate 2, similarly to the case of the backside illumination. A planarization film 83, and an insulation film 84 are formed in order from the semiconductor substrate 2 side, between the semiconductor substrate 2 and the laminated wiring layer 82.

The laminated wiring layer 82 has a plurality of wirings 86 which is laminated through an interlayer insulation film 85. The interlayer insulation film 85 is configured by silicon oxide film which is formed of, for example, silicon dioxide ($SiO_2$). The plurality of wirings 86 is formed, for example, of different metal, and are connected to each other through a plug or the like which is formed between layers. In addition, in the embodiment, the wiring layer which is provided on one plate surface side of the semiconductor substrate 2 is the laminated wiring layer 82 having a plurality of wirings, however, is not limited to this, and may be a wiring layer of single layer structure.

The planarization film 83 is provided on the front surface 2a side of the semiconductor substrate 2. The planarization film 83 is formed as an insulation film such as, for example, silicon oxide film. An MOS transistor 87 which configures the pixel 5 is provided in the planarization film 83 along with the photodiode 21.

The MOS transistor 87 has a source/drain region which is not shown, and a gate electrode 88. The source/drain region of the MOS transistor 87 is formed as an n-type region in a p-type semiconductor well region 26 which is formed on the front surface 2a side as the one plate surface side of the semiconductor substrate 2. The gate electrode 88 is formed on the front surface 2a side of the semiconductor substrate 2 in both regions between the source and drain regions of the MOS transistor 87. In this manner, each pixel 5 which is formed of the photodiode 21 and the MOS transistor 87 is separated by the element isolation region 27.

The insulation film 84 is provided on the planarization film 83, and functions as antireflection film. The insulation film 84 has a laminated structure in which a plurality of films with refractivity different from each other is laminated. According to the embodiment, the insulation film 84 has a two-layer structure which is formed of silicon oxide film 91 which is laminated from the semiconductor substrate 2 side, and hafnium oxide film 92. The laminated wiring layer 82 is provided on the insulation film 84.

A planarization film 93 with optical transparency is provided on the laminated wiring layer 82. The planarization film 93 is formed of, for example, an organic material such as resin. The color filter layer 35 and the plurality of micro lenses 36 are formed on the planarization film 93.

As described above, the solid-state imaging device 81 according to the embodiment is provided with the color filter layer 35 and the micro lens 36 on the front surface 2a side on which the laminated wiring layer 82 is provided, with respect to the semiconductor substrate 2. That is, in the solid-state imaging device 81, the laminated wiring layer 82 and the color filter layer 35 are provided on the same plate surface side as each other with respect to the semiconductor substrate 2, and the laminated wiring layer 82 is provided on the front surface 2a side to which light in input with respect to the semiconductor substrate 2.

In the above described backside illumination solid-state imaging device 81, an inter-pixel light shielding film 90 as an inter-pixel light shielding unit is provided at the inter-pixel boundary portion in the laminated wiring layer 82 which is formed on the insulation film 84. The inter-pixel light shielding film 90 is light shielding film which is formed along a boundary line between the pixels 5 adjacent to each other, on the insulation film 84, similarly to the inter-pixel light shielding film 40 which is included in the solid-state imaging device of the above described embodiment. That is, the inter-pixel light shielding film 90 is formed as a linear layer portion having a predetermined line width so as to be arranged along the side of a substantially square shape with respect to the pixel 5 which is substantially square, when planarly viewed.

As described above, the solid-state imaging device 81 according to the embodiment has an inter-pixel light shielding film 90 as an inter-pixel light shielding unit which is provided at the inter-pixel boundary portion, in between the semiconductor substrate 2 and the color filter layer 35. Specifically, the solid-state imaging device 81 has the inter-pixel light shielding film 90 on the insulation film 84 which is provided between the front surface 2a side of the semiconductor substrate 2 and the color filter layer 35.

The inter-pixel light shielding film 90 is provided so as to be concentrated at the boundary portion between different color pixels, in a clear bit sequence, similarly to the inter-pixel light shielding film 40 which is included in the solid-state imaging device according to the above described embodiment. A description of the detailed configuration of the inter-pixel light shielding film 90 will be omitted, since it has the same configuration as that of the inter-pixel light shielding film 40 according to the above described embodiment.

According to the solid-state imaging device 81 of the embodiment, in addition to the effect which is obtained by providing the inter-pixel light shielding film 40 in the above described embodiment, oblique light goes toward neighboring G pixel 5 without being condensed by each micro lens 36 is blocked, in between different color pixels, and it is possible to effectively reduce optical color mixing, since the inter-pixel light shielding film 90 is present at the inter-pixel boundary portion which is closest to the front surface 2a side as light receiving surface of the semiconductor substrate 2.

In addition, in the solid-state imaging device 81 according to the embodiment, it is possible to appropriately combine a configuration in which a light shielding film is included in the peripheral circuit region 4 as in the second embodiment, a configuration the inter-pixel light shielding film 90 is connected to the ground area of the semiconductor substrate 2 as in the third embodiment, a configuration of including a transparent electrode as in the fourth embodiment, or the like. In this manner, it is possible to obtain effects due to the solid-state imaging device including each configuration.

Sixth Embodiment

A sixth embodiment of the present disclosure will be described. A solid-state imaging device 101 according to the embodiment is a front side illumination CMOS solid-state imaging device similarly to the fifth embodiment, and uses a wiring which configures a laminated wiring layer which is provided on the front surface 2a side of a semiconductor substrate 2 as an inter-pixel light shielding unit, instead of the inter-pixel light shielding film 90 which is included in the solid-state imaging device 81 according to the fifth embodiment, or in addition to the inter-pixel light shielding film 90.

Figure 12:
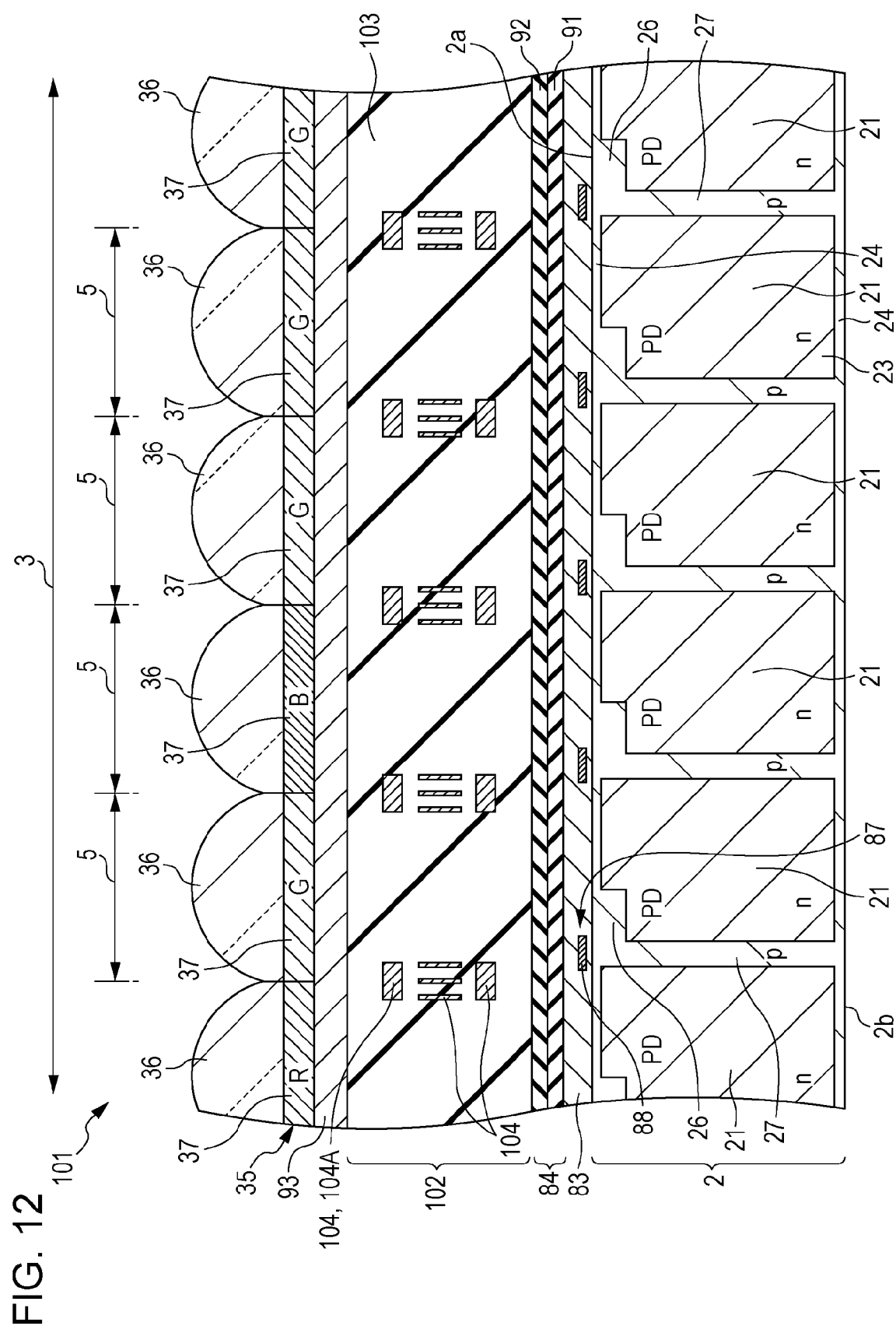
FIG. 12 is a cross-sectional view which shows a configuration of the solid-state imaging device according to a sixth embodiment of the present technology.

As shown in FIG. 12, the solid-state imaging device 101 according to the embodiment includes a laminated wiring layer 102 on the front surface 2a side of the semiconductor substrate 2 through a planarization film 83 and an insulation film 84.

The laminated wiring layer 102 has a plurality of wirings 104 which is laminated through an interlayer insulation film 103. The insulation film 103 is configured by silicon oxide film which is formed of, for example, silicon dioxide ($SiO_2$). The plurality of wirings 104 is formed of, for example, different metal, and are connected to each other through a plug, or the like which is formed between layers.

In addition, the solid-state imaging device 101 according to the embodiment uses a wiring of the uppermost layer, that is, a wiring 104A of the closest layer to the input side of light (hereinafter, referred to as "the uppermost layer wiring") among the plurality of wirings 104 which configures the laminated wiring layer 102. In the example shown in FIG. 12, the solid-state imaging device 101 includes the uppermost layer wiring 104A instead of the inter-pixel light shielding film 90 (refer to FIG. 11), that is, without including the inter-pixel light shielding film 90, in comparison to the solid-state imaging device 81 according to the fifth embodiment.

Figure 13:
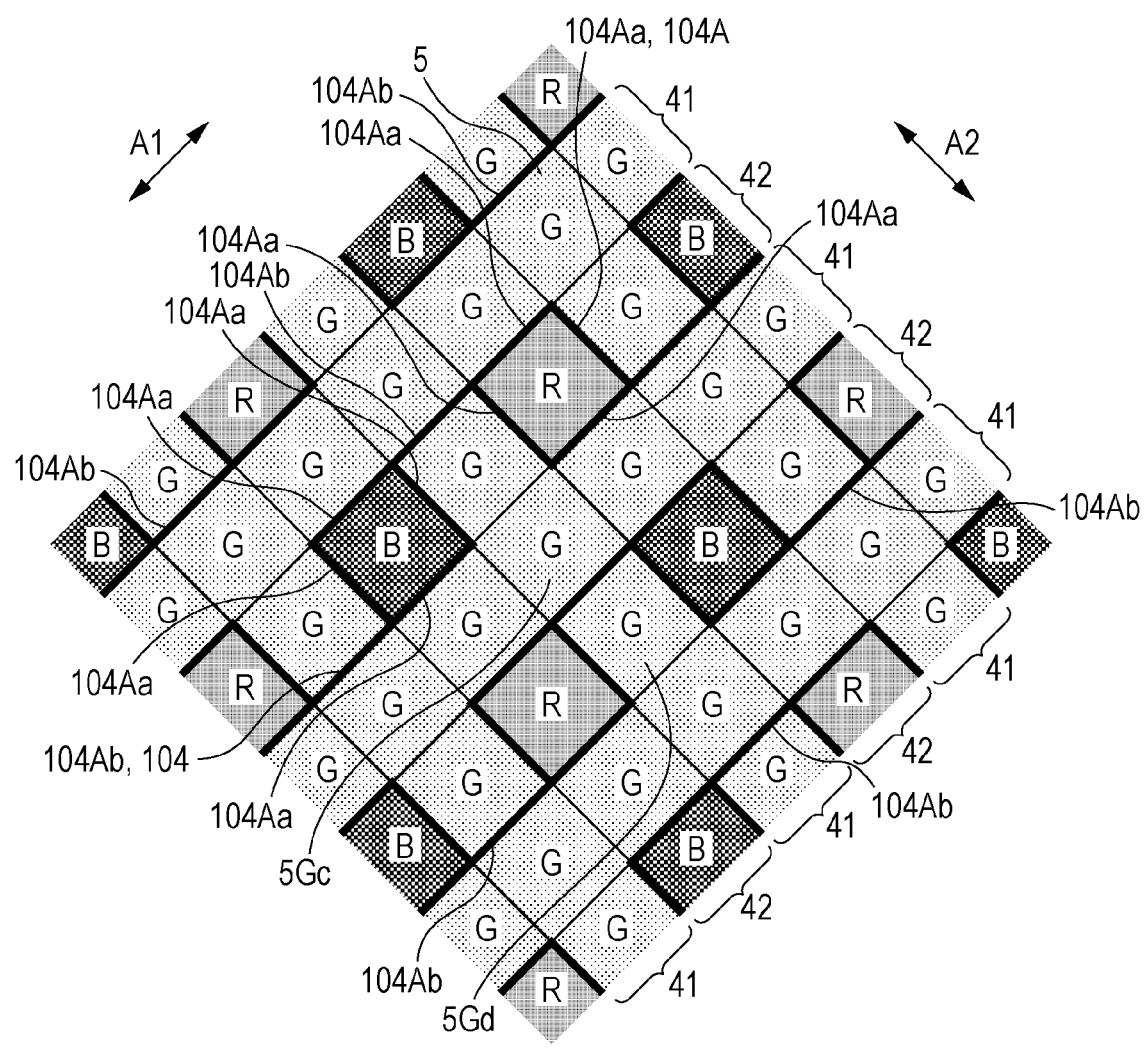
FIG. 13 is a plan view which shows the configuration of the solid-state imaging device according to the sixth embodiment of the present technology.
Figure 14:
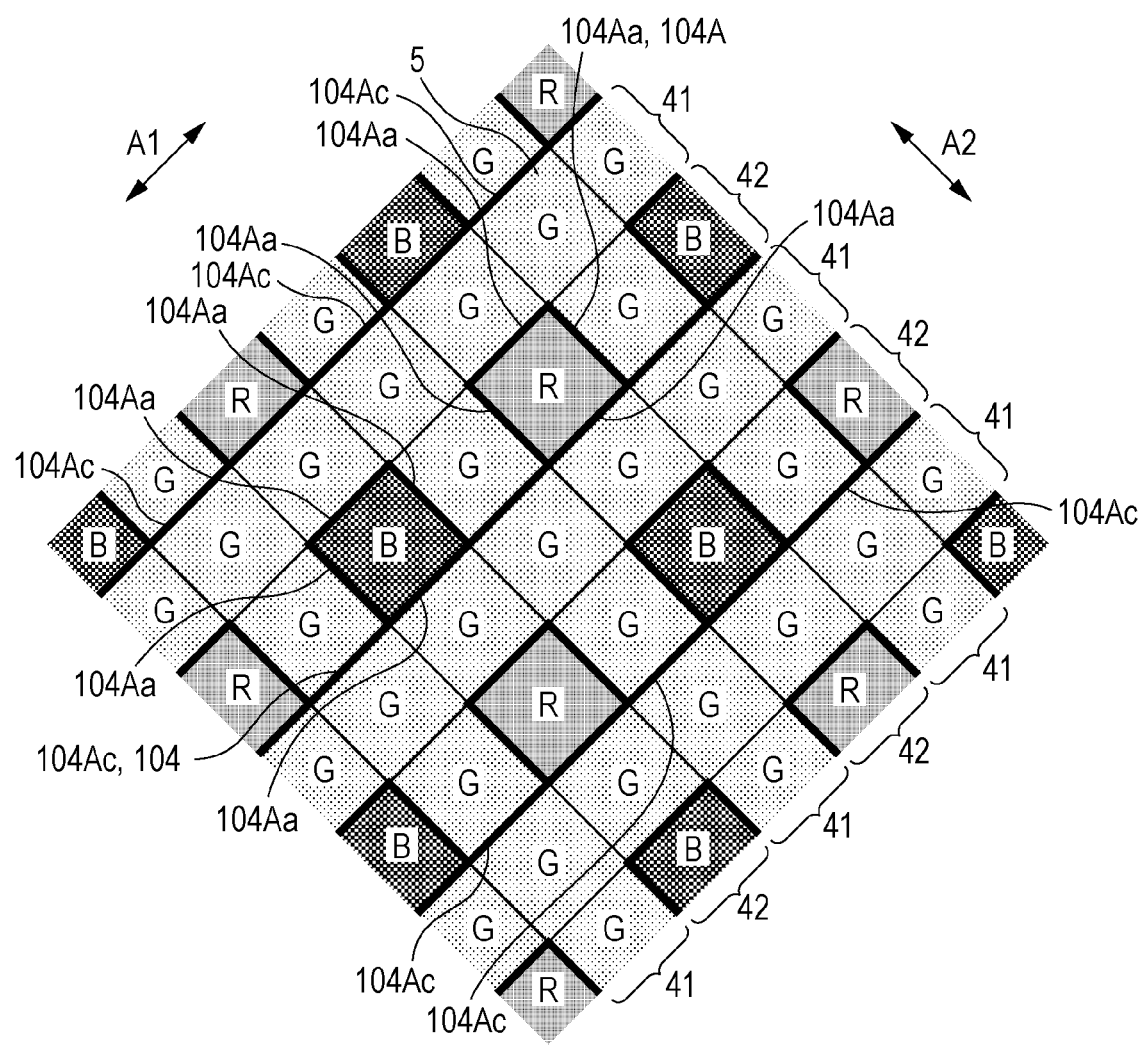
FIG. 14 is a plan view which shows the configuration of the solid-state imaging device according to the sixth embodiment of the present technology.

The uppermost layer wiring 104A is provided so as to be concentrated at the boundary portion between the different color pixels in the clear bit sequence, similarly to the inter-pixel light shielding film 40 or the like which is included in the solid-state imaging device according to the above described embodiment. An example of the detailed layout of the uppermost layer wiring 104A is shown in FIGS. 13 and 14. In addition, in FIGS. 13 and 14, for convenience, the uppermost layer wiring 104A which is present in the laminated wiring layer 102 which is provided between the semiconductor substrate 2 and the color filter layer 35 is denoted by a thick line which is drawn along the boundary line between the pixels 5 in the pixel array.

FIG. 13 is the same layout as the layout of the inter-pixel light shielding film 40 which is provided at the boundary portion between the different color pixels in the solid-state imaging device 61 according to the third embodiment, and the layout of the second connection light shielding film 64 (refer to FIG. 8) which is provided at the boundary portion between the same color pixels, and shows a case where the uppermost layer wiring 104A is provided.

That is, in the example shown in FIG. 13, in the clear bit sequence, the uppermost layer wiring 104A includes a first wiring portion 104Aa which surrounds respective four sides of the R pixel and B pixel, and a second wiring portion 104Ab which connects these first wiring portions 104Aa, when planarly viewed.

In the example shown in FIG. 13, the second wiring portion 104Ab is alternately arranged with respect to the second direction (refer to arrow A2) for each R pixel, or B pixel in the multi-colored pixel column 42 which is arranged along the first direction (refer to arrow A1), and connects the first wiring portions 104Aa which surround respective four sides of the R pixel and B pixel. That is, the second wiring portion 104Ab is provided at the inter-pixel boundary portion on one side with respect to the second direction between the R pixel and B pixel interposing one G pixel therebetween toward a predetermined direction in the first direction (for example, upright on the diagonally right in FIG. 13), and is provided at the inter-pixel boundary portion on the other side with respect to the second direction between the R pixel and B pixel interposing one G pixel therebetween, and is alternately arranged between the B pixel and R pixel in each of them with respect to the second direction, in the multi-colored pixel column 42 which is arranged along the first direction.

Similarly to FIG. 13, FIG. 14 shows a case where the uppermost wiring layer 104A is provided with a layout the same as that of another example (refer to FIG. 9) of the inter-pixel light shielding film 40 and the second connection light shielding film 64 in the solid-state imaging device 61 according to the third embodiment.

That is, in the example shown in FIG. 14, in the clear bit sequence, the uppermost wiring layer 104A has the first wiring portion 104Aa which surrounds respective four sides of the R pixel and the B pixel, and a second wiring portion 104Ac which connects these first wiring portions 104Aa to each other, when planarly viewed.

In the example shown in FIG. 14, the second wiring portion 104Ac is arranged on the same side with respect to the second direction (refer to arrow A2) for each R pixel and the B pixel, in the multi-colored pixel column 42 which is arranged along the first direction (refer to arrow A1), and connects the first wiring portions 104Aa which surround respective four sides of the R pixel and the B pixel to each other. That is, in the example shown in FIG. 14, the second wiring portion 104Ac is provided at the inter-pixel boundary portion on the same side with respect to the second direction along the first direction, in the multi-colored pixel column 42 which is arranged along the first direction.

In the example shown in FIG. 14, the second wiring portion 104Ac is provided at the inter-pixel boundary portion which correspond to the lower side on the diagonally right of the G pixel of the multi-colored pixel column 42 which is arranged along the first direction as the inter-pixel boundary portion on the same side with respect to the second direction, however, it may be provided at the opposite side thereto, that is, at the inter-pixel boundary portion which correspond to the upper side on the diagonally left of the G pixel of the multi-colored pixel column 42 which is arranged along the first direction.

According to the solid-state imaging device 101 of the embodiment, similarly to the solid-state imaging device 1 according to the first embodiment, it is possible to suppress the optical color mixing and the Mg flare, and to improve the sensitivity.

In the solid-state imaging device 101 according to the embodiment, the uppermost wiring layer 104A is provided so as to concentrate at the inter-pixel boundary portion in the combination of the different color pixels, that is, at the boundary portion between the different color pixels, in the clear bit sequence. In consideration of giving priority to a suppress of the optical color mixing due to the uppermost wiring layer 104A in between the different color pixels, and to an improvement of the sensitivity due to an absence of the uppermost wiring layer 104A in between the same color pixels, the uppermost wiring layer 104A is concentrated between the different color pixels rather than the same color pixels. In addition, since the optical color mixing is suppressed due to the uppermost wiring layer 104A in between the different color pixels, it is possible to suppress the Mg flare which occurs due to the optical color mixing during the signal processing.

The improvement of sensitivity due to the solid-state imaging device 101 according to the embodiment will be further described. For example, when the uppermost wiring layer 104A which configures the laminated wiring layer 102 is provided only for obtaining power, or the like, as shown in FIG. 15, the uppermost wiring layer 104A is drawn so as to creep the inter-pixel boundary portion, and is provided at the entire inter-pixel boundary portion.

Figure 15:
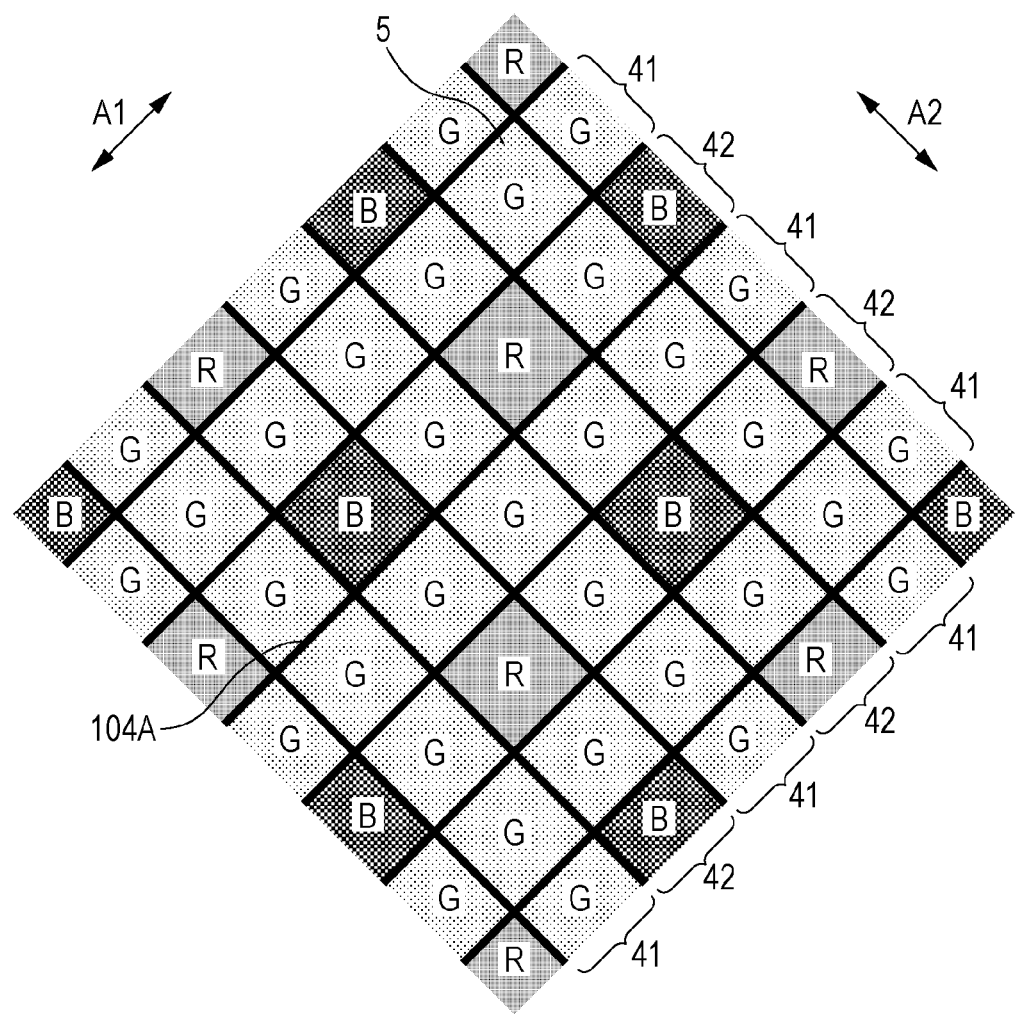
FIG. 15 is a plan view which shows a configuration of the solid-state imaging device of a comparison example of the present technology.

As shown in FIG. 15, when the uppermost wiring layer 104A is provided at the entire inter-pixel boundary portion, a part of light which is to be sensed by the photodiode 21 of the pixel 5 is blocked by the uppermost wiring layer 104A of the laminated wiring layer 102. There is a possibility that so-called optical vignetting occurs in the entire inter-pixel boundary portion. In this point, according to the solid-state imaging device 101 of the embodiment, since the arrangement of the uppermost wiring layer 104A is omitted at a part of the boundary portion between the same color pixels, the light which is blocked off due to the presence of the uppermost wiring layer 104A at the inter-pixel boundary portion reaches the photodiode 21 to that extent. Due to this, the sensitivity is improved.

In addition, the layout of the uppermost wiring layer 104A included in the solid-state imaging device 101 is not particularly limited to the above described example. The uppermost wiring layer 104A may be provided so as to concentrate at the boundary portion between the different color pixels with respect to the boundary portion between the same color pixels, so that a wiring area at the boundary portion between the same color pixels becomes smaller than that at the boundary portion between the different color pixels.

In addition, in the solid-state imaging device 101 according to the embodiment, the uppermost wiring layer 104A is used as the inter-pixel light shielding unit, among the plurality of wirings 104 which configures the laminated wiring layer 102, however, the wiring 104 other layers than the uppermost wiring layer 104A may be used as the inter-pixel light shielding unit.

In addition, in the solid-state imaging device 101 according to the embodiment, the wiring layer which is provided on one plate surface side of the semiconductor substrate 2 is the laminated wiring layer 102 having the plurality of wirings, however, the wiring layer is not limited to this, and may be a wiring layer of a single layer structure. In this case, the single layer wiring is used as the inter-pixel light shielding unit.

Correction of Signal Processing

As shown in FIGS. 13 and 14, in the configuration in which the uppermost wiring layer 104A is provided so as to concentrate at the boundary portion between the different color pixels in the clear bit sequence, the difference in sensitivity between the pixel 5 occurs due to the presence or absence of the uppermost wiring layer 104A with respect to four sides of each pixel 5 which is rectangular when planarly viewed. Therefore, it is preferable to perform the above described correction of the signal processing, even in the solid-state imaging device 101 according to the embodiment.

The example shown in FIG. 13 will be described. In a case of the layout of the uppermost wiring layer 104A in the clear bit sequence shown in FIG. 13, a G pixel of 5Gc (hereinafter, referred to as "the third G pixel") in which the uppermost wiring layer 104A is present only at the inter-pixel boundary portion which corresponds to one side of the four sides when planarly viewed, and a G pixel 5Gd (hereinafter, referred to as "the fourth G pixel") in which the uppermost wiring layer 104A is present at the inter-pixel boundary portion which corresponds to three sides of the four sides when planarly viewed, with respect to the G pixel. That is, the uppermost wiring layer 104A is present at one inter-pixel boundary portion at the periphery of the third G pixel 5Gc, and the uppermost wiring layer 104A is present at three inter-pixel boundary portions at the periphery of the fourth G pixel 5Gd.

In such third G pixel 5Gc and fourth G pixel 5Gd, the difference in sensitivity occurs due to the presence or absence of the uppermost wiring layer 104A at the periphery of each pixel 5. That is, due to the light shielding operation of the uppermost wiring layer 104A, even in the same G pixel, the difference in sensitivity occurs because of the difference in intensity of light received by the photodiode 21 of the pixel 5, due to the presence or absence of the uppermost wiring layer 104A.

In this manner, the difference in sensitivity between the third G pixel 5Gc and the fourth G pixel 5Gd occurs between the pixels 5 due to the difference in amount of the uppermost wiring layer 104A at the inter-pixel boundary portion between pixels 5 which are present at the periphery of each pixel 5Gc and 5Gd. Here, the amount of uppermost wiring layer 104A includes all of quantitative elements of the uppermost wiring layer 104A which causes the difference in sensitivity in between the pixels 5, for example, the number of places where the uppermost wiring layer 104A is provided at the periphery of each pixel 5 (the number of sides where the uppermost wiring layer 104A is provided among four sides of the rectangular pixel 5 when planarly viewed), the length or line width of the uppermost wiring layer 104A which is provided at each the inter-pixel boundary portion, that is, the area of the uppermost wiring layer 104A, or the like.

Therefore, in the solid-state imaging device 101 according to the embodiment, the correction of the difference in sensitivity is performed on the basis of the magnitude of the difference in sensitivity between the above described third G pixel 5Gc and the fourth G pixel 5Gd, with respect to the output value of the output signal from each pixel 5 during the signal processing in the column signal processing circuit 7 which is provided at the peripheral circuit region 4. The correction of the difference in sensitivity is performed in detail as follows.

According to the embodiment, for example, the fourth G pixel 5Gd where the uppermost wiring layer 104A is present at the inter-pixel boundary portion which corresponds to three sides of the four sides, when planarly viewed, has low sensitivity with respect to the third G pixel 5Gc where the uppermost wiring layer 104A is present at the inter-pixel boundary portion which corresponds to one side of the four sides, when planarly viewed. Here, the difference in sensitivity between the sensitivity S3(%) of the third G pixel 5Gc and the sensitivity S4 (<S3)(%) of the fourth G pixel 5Gd is set to α1(=S3-S4)(%).

In this manner, when the difference in sensitivity α1 (%) is present between the third G pixel 5Gc and the fourth G pixel 5Gd, the correction of increasing gain of the fourth G pixel 5Gd with low sensitivity is performed, by changing the gain of signal for each pixel 5, in the processing of signal which is output from each pixel 5 due to the column signal processing circuit 7, according to the value of α1 (%) as the difference in sensitivity. In this case, the correction of difference in sensitivity is performed on the basis of following expression (3).

$$\beta 1 = \gamma 1 \times (100 + \alpha 1)/100 \quad (3)$$

here, β1 is the correction value, and γ1 is the output value of the output signal from the fourth G pixel 5Gd.

Accordingly, for example, when the sensitivity S3 of the third G pixel 5Gc is 90%, and the sensitivity S4 of the fourth G pixel 5Gd is 80%, α1 is 10(%). In this case, according to the above expression (3), a value which is multiplied by a value of 1.1 with respect to the output value γ1 of the fourth G pixel 5Gd is calculated as the correction value β1.

In addition, in the example of the above described correction of difference in sensitivity, a case where the gain of the fourth G pixel 5Gd with low sensitivity is increased is described, between the third G pixel 5Gc and the fourth G pixel 5Gd, however, the correction of reducing the gain of the third G pixel 5Gc with high sensitivity may be performed. In this case, the correction of difference in sensitivity is performed on the basis of following expression (4).

$$\beta 1 = \eta 1 \times (100 - \alpha 1)/100 \quad (4)$$

here, β1 is the correction value, and η1 is the output value of the output signal from the third G pixel 5Gc.

Accordingly, for example, when the sensitivity S1 of the third G pixel 5Gc is 90%, and the sensitivity S4 of the fourth G pixel 5Gd is 80%, α1 is 10(%). In this case, according to the above expression (4), a value which is multiplied by a value of 0.9 with respect to the output value η1 of the third G pixel 5Gc is calculated as the correction value β1.

As described above, in the solid-state imaging device 101 according to the embodiment, the column signal processing circuit 7 corrects the output value (γ1 and η1) of the output signal from each pixel 5 on the basis of the magnitude (α1) of the difference in sensitivity which occurs between the plurality of pixels 5 due to the difference in amount of the uppermost wiring layer 104A at the inter-pixel boundary portion which is present at the periphery of each pixel 5.

In this manner, in the solid-state imaging device 101 according to the embodiment, it is possible to correct the difference in sensitivity which occurs between the plurality of pixels 5 due to uneven presence of the uppermost wiring layer 104A at the plurality of inter-pixel boundary portions, while improving the sensitivity by suppressing the optical color mixing and the Mg flare, by performing the correction of difference in sensitivity. In this manner, it is possible to obtain good sensitivity characteristics.

Configuration Example of Electronic Apparatus

Figure 16:
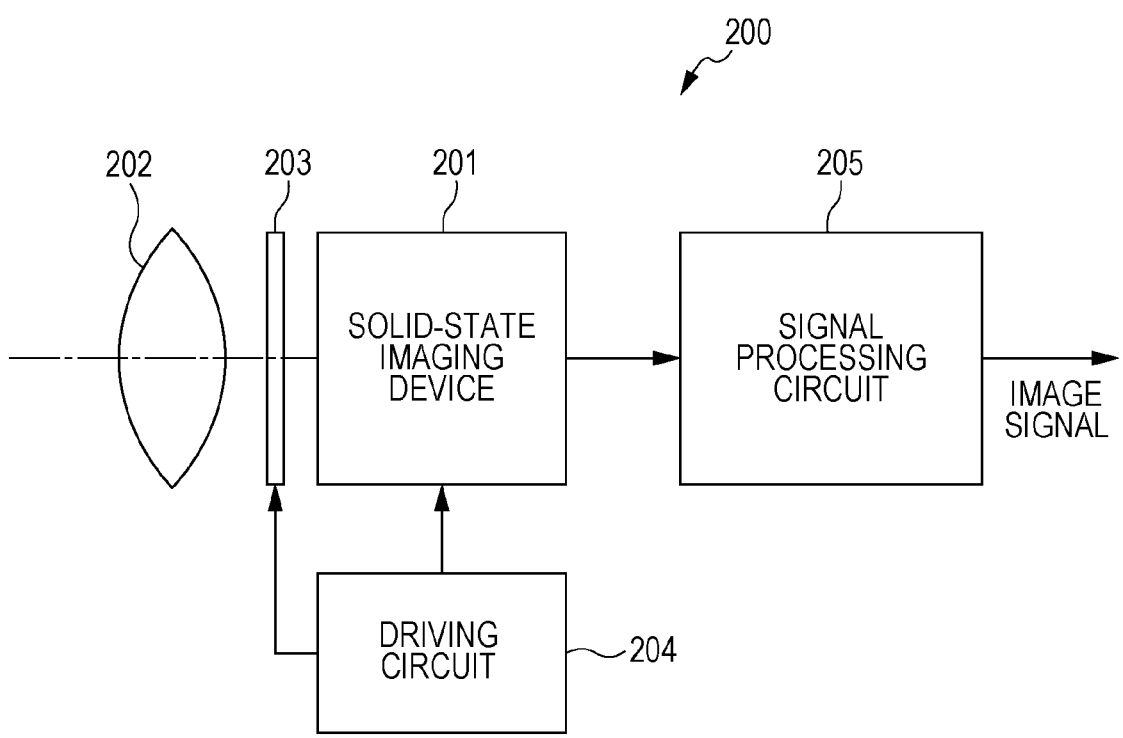
FIG. 16 is a diagram which shows a configuration of an electronic apparatus according to a first embodiment of the present technology.

The solid-state imaging device according to the above described embodiment is applied to a variety of electronic apparatuses, for example, a digital still camera and digital video camera which are so-called digital cameras, a mobile phone with a function of imaging, the other devices, or the like. Hereinafter, a video camera 200 as an example of an electronic apparatus which has the solid-state imaging device according to the above described embodiment will be described using FIG. 16.

The video camera 200 performs photographing of a still image or a moving image. The video camera 200 includes a solid-state imaging device 201 according to the above described embodiment, an optical system 202, a shutter unit 203, a driving circuit 204, and a signal processing circuit 205.

The optical system 202 is configured as an optical lens system including one lens, or a plurality of optical lenses, and guides input light to a light receiving sensor of the solid-state imaging device 201. The optical system 202 forms an image light (input light) from an object on the imaging surface of the solid-state imaging device 201 as an image. In this manner, a signal charge is accumulated in the solid-state imaging device 201 for a certain period. The shutter unit 203 has a configuration for controlling irradiation time and shielding time of light which is radiated to the solid-state imaging device 201 for each of pixels 5.

The driving circuit 204 drives the solid-state imaging device 201. The driving circuit 204 generates a driving signal (timing signal) for driving the solid-state imaging device 201 at a predetermined timing, and supplies the signal to the solid-state imaging device 201. The transmission operation or the like of a signal electrode of the solid-state imaging device 201 is controlled by the driving signal which is supplied to the solid-state imaging device 201 from the driving circuit 204. That is, the solid-state imaging device 201 performs the transmission operation or the like of a signal charge by the driving signal which is supplied from the driving circuit 204.

The driving circuit 204 has a function of generating a variety of pulse signals as the driving signal for driving the solid-state imaging device 201, and a function as a driver which converts the generated pulse signal to a drive pulse for driving the solid-state imaging device 201. The driving circuit 204 generates and supplies the driving signal for controlling the operation of the shutter unit 203.

The signal processing circuit 205 has a function of performing various signal processing, and processes the output signal from the solid-state imaging device 201. The signal processing circuit 205 outputs a video signal by processing the input signal. The video signal which is output from the signal processing circuit 205 is stored to a storage medium such as a memory, or is output to a monitor. In addition, the video camera 200 includes a power unit such as a battery which supplies power to the driving circuit 204 or the like, a storage unit which stores the video signal which is generated by imaging, or the like, a control unit which controls the entire device, or the like.

In the video camera 200 provided with the above described configuration, the driving circuit 204 functions as a driving unit which generates the driving signal for driving the solid-state imaging device 201. In addition, according to the video camera 200 which is provided with the solid-state imaging device 201 according to the embodiment, it is possible to suppress the optical color mixing, or the Mg flare, and to improve the sensitivity.

Correction Difference in Sensitivity

In the video camera 200, by changing the shutter time using the shutter unit 203 for each pixel 5, it is possible to correct the difference in sensitivity which occurs due to the presence or absence of the inter-pixel light shielding film 40, the uppermost wiring layer 104A, or the like, with respect to the four sides of each pixel 5 which is rectangular when planarly viewed, as described above. The correction of the difference in sensitivity which occurs when changing the shutter time for each pixel 5 (hereinafter, referred to as "the correction of difference in sensitivity due to the shutter time") is performed using the same method as that of the above described correction of difference in sensitivity.

The correction of difference in sensitivity using the shutter time will be described. In addition, since the correction of difference in sensitivity using the shutter time is similarly performed with respect to the difference in sensitivity due to the presence or absence of the inter-pixel light shielding film 40, the inter-pixel light shielding film 90, or the uppermost wiring layer 104A, with respect to the four sides of each pixel 5 which is rectangular when planarly viewed, the case of the inter-pixel light shielding film 40 will be exemplified herein.

In addition, for the pixel 5 having the difference in sensitivity as a target of the correction of difference in sensitivity using the shutter time, a predetermined pixel 5 with relatively high sensitivity is set to the "high-sensitivity pixel", and a predetermined pixel 5 with relatively low sensitivity is set to the "low-sensitivity pixel".

In the correction of difference in sensitivity using the shutter time, the difference in sensitivity of the sensitivity S6 (<S5)(%) of the low-sensitivity pixel with respect to the sensitivity S5(%) of the high-sensitivity pixel is set to a2(=S5-S6)(%).

In this manner, when the difference in sensitivity $\alpha 2(\%)$ is present, it is possible to perform the correction of increasing the gain of the low-sensitivity pixel of which the sensitivity is low, by changing the shutter time for each pixel 5 using the shutter unit 203, that is, the irradiation time or the shielding time of light which is radiated to the solid-state imaging device 201, according to the value of the difference in sensitivity $\alpha 2(\%)$. In this case, the correction of difference in sensitivity using the shutter time is performed on the basis of the following expression (5).

$$\beta 2 = \gamma 2 \times (100 + \alpha 2)/100 \qquad (5)$$

here, $\beta 2$ is the correction value, and $\gamma 2$ is the output value of the output signal from the low-sensitivity pixel.

Accordingly, for example, when the sensitivity S5 of the high-sensitivity pixel is 100%, and the sensitivity S6 of the low-sensitivity pixel is 90%, $\alpha 2$ becomes 10(%). In this case, according to the above described expression (5), a value in which the output value $\gamma 2$ of the low-sensitivity pixel is multiplied by the value of 1.1 becomes the correction value $\beta 2$.

In this case, the shutter time of the shutter unit 203 is controlled so as to satisfy the above described expression (5). In the correction of difference in sensitivity using the shutter time, when increasing the gain of the low-sensitivity pixel of which the sensitivity is low, the irradiation time of light with respect to the low-sensitivity pixel of which the sensitivity is low becomes long compared to the high-sensitivity pixel of which the sensitivity is high, or the shielding time of light with respect to the low-sensitivity pixel becomes short compared to the high-sensitivity pixel.

In addition, the case where the correction is performed by increasing the gain of the low-sensitivity pixel of which the sensitivity is low is exemplified between the high-sensitivity pixel and the low-sensitivity pixel, in the above described example where the correction of difference in sensitivity using the shutter time, however, the correction of increasing the gain of the high-sensitivity pixel of which the sensitivity is high can be performed. In this case, the correction of difference in sensitivity using the shutter time is performed on the basis of the following expression (6).

$$\beta 2 = \eta 2 \times (100 - \alpha 2)/100 \qquad (6)$$

here, $\beta 2$ is the correction value, and $\eta 2$ is the output value of the output signal from the high-sensitivity pixel.

Accordingly, for example, when the sensitivity S5 of the high-sensitivity pixel is 100%, and the sensitivity S6 of the low-sensitivity pixel is 90%, $\alpha 2$ becomes 10(%). In this case, according to the above described expression (6), a value in which the output value $\eta 2$ of the high-sensitivity pixel is multiplied by the value of 0.9 becomes the correction value $\beta 2$.

In this case, the shutter time of the shutter unit 203 is controlled so as to satisfy the above described expression (6). In the correction of difference in sensitivity using the shutter time, when decreasing the gain of the high-sensitivity pixel of which the sensitivity is high, the irradiation time of light with respect to the high-sensitivity pixel of which the sensitivity is high becomes short compared to the low-sensitivity pixel of which the sensitivity is low, or the shielding time of light with respect to the high-sensitivity pixel becomes long compared to the low-sensitivity pixel.

The above described correction of difference in sensitivity using the shutter time is performed by the driving circuit 204 which controls the operation of the shutter unit 203, in the video camera 200. That is, in the video camera 200, the driving circuit 204 corrects the output value of the output signal from each pixel 5 on the basis of the magnitude of the difference in sensitivity which occurs between the pixels 5 due to the difference in the amount of the inter-pixel light shielding film 40 as the inter-pixel light shielding unit at the inter-pixel boundary portion which is present at the periphery of each pixel 5, by controlling at least any one of the irradiation time or the shielding time of light using the shutter unit 203.

In this manner, by performing the correction of difference in sensitivity using the shutter time in the video camera 200 according to the embodiment, it is possible to correct the difference in sensitivity which occurs between the plurality of pixels 5 due to uneven presence of the inter-pixel light shielding film 40 at the plurality of inter-pixel boundary portions, while improving the sensitivity by suppressing the optical color mixing and the Mg flare. In this manner, it is possible to obtain good sensitivity characteristics.

Application Example of Present Technology

In the above described embodiments, the clear bit sequence has been exemplified as the pixel array included in the solid-state imaging device, however, the present technology is applicable to any of pixel arrays which include the different pixels from each other, and the same pixels as each other, in addition to the clear bit sequence.

As the pixel array which includes the different pixels from each other, and the same pixels as each other, there is a pixel array as shown below. In addition, the example of the pixel array shown below is a case where the inter-pixel light shielding film 40 as the inter-pixel light shielding unit is provided at only the inter-pixel boundary portion of the different pixels from each other, between the different pixels from each other and the same pixels as each other. However, as the inter-pixel light shielding unit, the inter-pixel light shielding film 90 in the front side illumination solid-state imaging device, or the uppermost wiring layer 104A is applicable, similarly to the inter-pixel light shielding film 40.

Figure 17A:
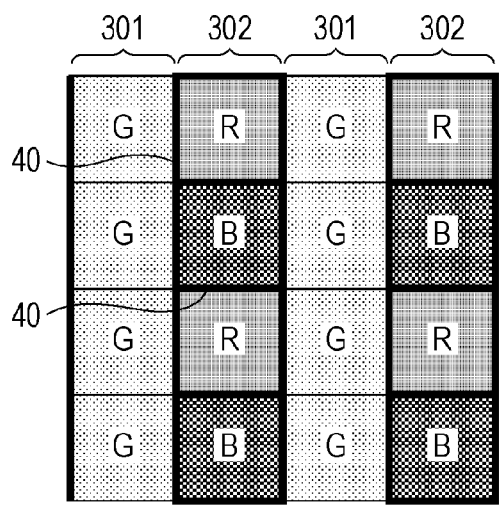
FIGS. 17A to 17D are diagrams which show examples of pixel arrays as an application example of the present technology.

FIGS. 17A to 17D show examples of the pixel arrays of square grid arrays in which the plurality of pixels is arranged in a matrix. FIG. 17A is a pixel array in which the pixel column 301 which is formed only of the G pixel, and the pixel column 302 which is formed of the R pixel and B pixel are alternately arranged. In the pixel array shown in FIG. 17A, the R pixels and the B pixels are positioned on the same row, respectively. That is, the pixel column 302 which is formed of the R pixel and the B pixel causes the pixels to be positioned on the same row, respectively. Accordingly, in the pixel array shown in FIG. 17A, the row in which the G pixel and the R pixel are alternately arranged, and the row in which the G pixel and the B pixel are alternately arranged are alternately arranged, when viewed in the row direction.

In the pixel array shown in FIG. 17A, as the different color pixels from each other where the inter-pixel light shielding film 40 is provided, there are adjacent pixels of the R pixel and the B pixel which configures the pixel column 302, and the adjacent pixels of the G pixel of the pixel column 301 and the R pixel of the pixel column 302, or the B pixel which are adjacent to each other in the row direction. In addition, as the same color pixels as each other, there are adjacent pixels of G color pixel which configure the pixel column 301.

Figure 17B:
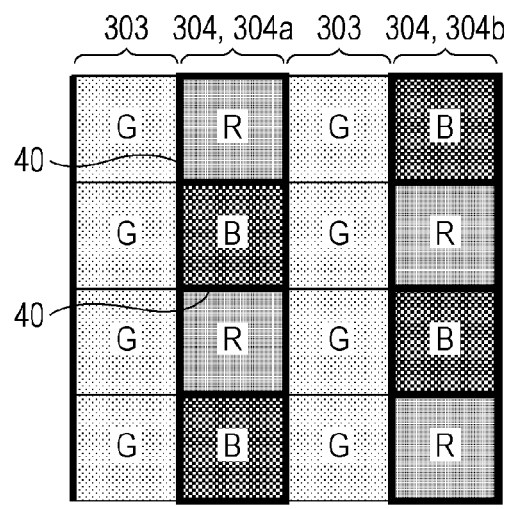

FIG. 17B is a pixel array in which the pixel column 303 which is configured only by the G pixel, and the pixel column 304 which is configured by the R pixel and B pixel are alternately arranged. In the pixel array shown in FIG. 17B, the pixel column 304 which is arranged through the pixel column 303 which is configured only by the G pixel is alternately arranged with the R pixel and B pixel in the row direction. Accordingly, in the pixel array shown in FIG. 17B, the array of the pixel column 304*a* positioned on one side (left side in FIG. 17B) of the pixel column 303 which is configured only by the G pixel, and the array of the pixel column 304*b* positioned on the other side (right side in FIG. 17B) of the same pixel column 303 are different from each other in the arrangement of the R pixel and B pixel.

In the pixel array shown in FIG. 17B, as the different color pixels from each other where the inter-pixel light shielding film 40 is provided, there are adjacent pixels of the R pixel and the B pixel which configures the pixel column 304, and the adjacent pixels of the G pixel of the pixel column 303 and the R pixel of the pixel column 304, or the B pixel which are adjacent to each other in the row direction. In addition, as the same color pixels as each other, there are adjacent pixels of G color pixel which configure the pixel column 303.

Figure 17C:
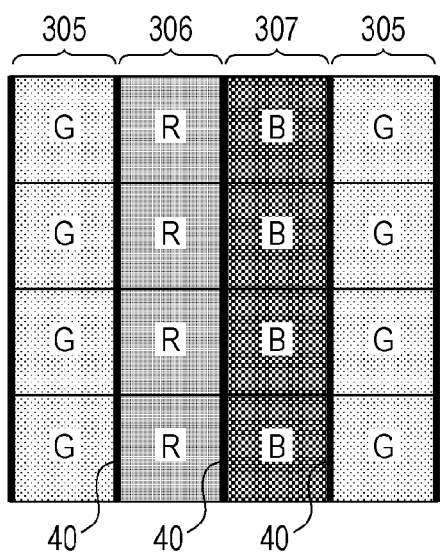

FIG. 17C has a pixel array of stripes in which the pixel column 305 which is formed only of the G pixel, the pixel column 306 which is formed only of the R pixel, and the pixel column 307 which is formed only of the B pixel are alternately arranged.

In the pixel array shown in FIG. 17C, as the different color pixels from each other at which the inter-pixel light shielding film 40 is provided, there are adjacent pixels of the G pixel and R pixel the adjacent pixels of the R pixel and B pixel, and the adjacent pixels of the B pixel and G pixel which are adjacent to each other in the row direction. In addition, as the same color pixels as each other, there are adjacent pixels of the G pixel, R pixel, and B pixel which configure each of the pixel rows, 305, 306, and 307.

Figure 17D:
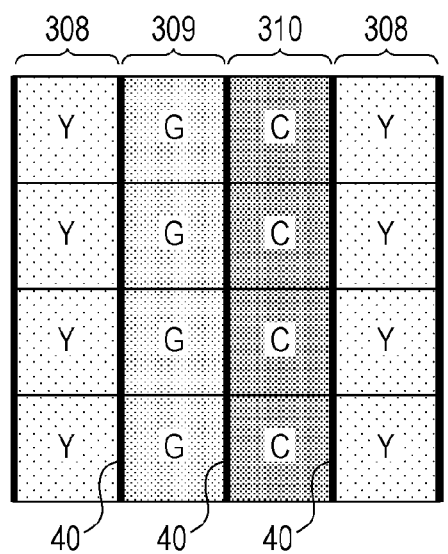

FIG. 17D is a striped pixel array in which a pixel column 308 formed only of yellow (Y) pixels 5 (hereinafter, referred to as "Y pixel"), a pixel column 309 which is formed only of G pixels, and a pixel column 310 which is formed only of cyan (C) pixels 5 (hereinafter, referred to as "C pixel") are alternately arranged. In addition, in FIG. 17D, the yellow is denoted by "Y", and the cyan is denoted by "C" for colors of each pixel 5.

In the pixel array shown in FIG. 17D, as the different color pixels from each other at which the inter-pixel light shielding film 40 is provided, there are adjacent pixels of the Y pixel and the G pixel, the adjacent pixels of the G pixel and the C pixel, and the adjacent pixels of the C pixel and the Y pixel. In addition, as the same color pixels as each other, there are adjacent pixels which are between the Y pixels, the G pixels, and C pixels which configure each pixel column 308, 309, and 310.

Figure 18:
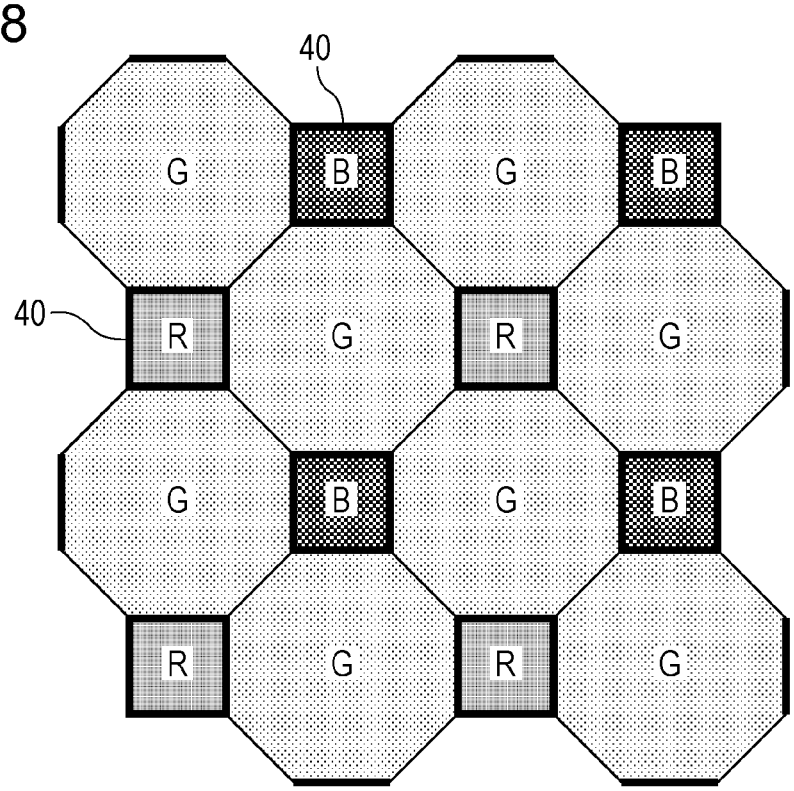
FIG. 18 is a diagram which shows an example of the pixel array as an application example of the present technology.

FIG. 18 is a pixel array which includes a G pixel of octagonal shaped, more specifically, the shape of a color filter, and a square shaped R pixel and B pixel which have each the length of the octagonal shape as the length of one side thereof. In the example shown in FIG. 18, the octagonal shaped G pixel and the square shaped R pixel, or B pixel are alternately arranged.

In the pixel array shown in FIG. 18, as the different color pixels from each other at which the inter-pixel light shielding film 40 is provided, there are adjacent pixels of the G pixel and R pixel, or B pixel, which are adjacent to each other in the row direction, and the column direction. In addition, as the same color pixels as each other, there are adjacent pixels of the G pixels which are adjacent to each other in the diagonal direction.

Figure 19:
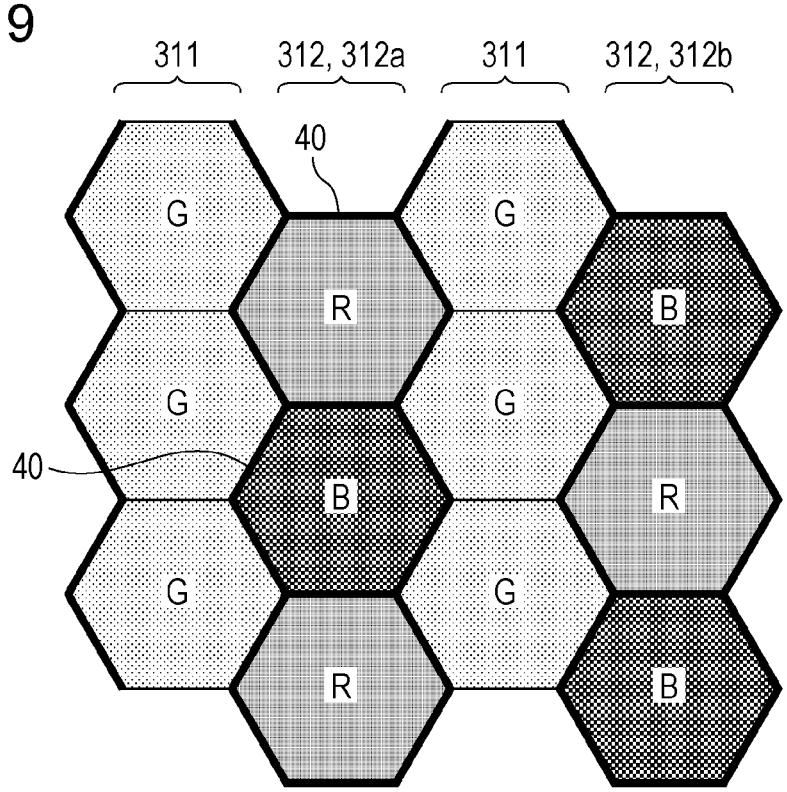
FIG. 19 is a diagram which shows an example of the pixel array as an application example of the present technology.

FIG. 19 is a so-called honeycomb shaped pixel array which is formed of a plurality of hexagonal shaped pixels. In the pixel array shown in FIG. 19, a pixel column 311 which is formed only of the G pixel, and a pixel column 312 which is formed of the R pixel and the B pixel are alternately arranged in a state of being deviated by ½ pitch in the column direction (vertical direction in FIG. 19). In addition, in the pixel array shown in FIG. 19, the pixel column 312 which is arranged through the pixel column 311 which is formed only of the G pixel arranges the R pixel and the B pixel alternately in the row direction (transverse direction in FIG. 19). Accordingly, in the pixel array shown in FIG. 19, in the row direction, the array of a pixel column 312a which is positioned at one side (the left side in FIG. 19) of the pixel column 311 which is formed only of the G pixel, and the array of a pixel column 312b which is positioned at the other side (the right side in FIG. 19) of the same pixel column 311 have the different pixel array of the R pixel and the B pixel from each other.

In the pixel array shown in FIG. 19, as the different color pixels from each other at which the inter-pixel light shielding film 40 is provided, there are adjacent pixels of the R pixel and the B pixel which configures the pixel column 312, and the adjacent pixels of the G pixel and R pixel, or the B pixel which are adjacent to each other in the diagonal direction. In addition, as the same color pixels as each other, there are adjacent pixels of G color pixel which configure the pixel column 311.

Figure 20:
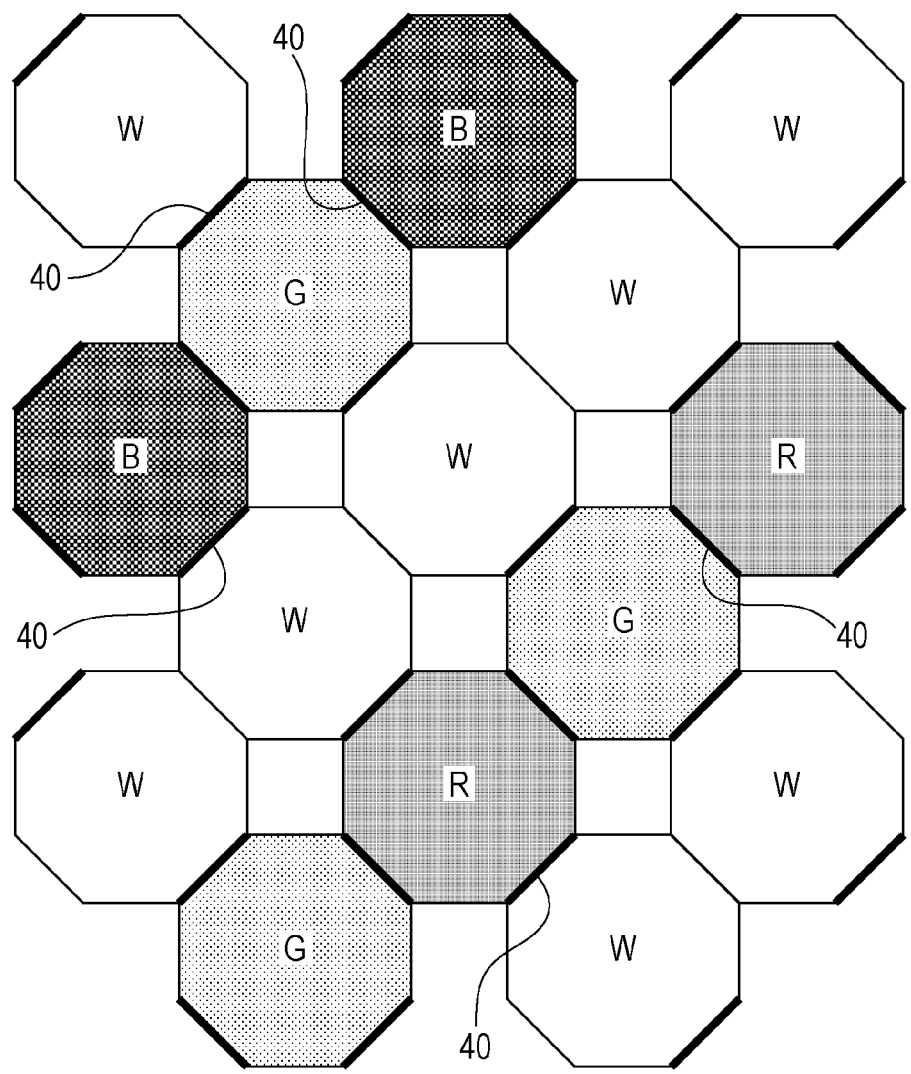
FIG. 20 is a diagram which shows an example of the pixel array as an application example of the present technology.

FIG. 20 is a pixel array in which the plurality of octagonal shaped pixels is differently arranged from each other in each of the row direction (transverse direction in FIG. 20), and the column direction (vertical direction in FIG. 20), and is a pixel array which includes a so-called white pixel (W) (hereinafter, referred to as "W pixel"). In the pixel array shown in FIG. 20, with respect to each direction of the row direction and the column direction, a pixel array in which the W pixel and G pixel are alternately arranged, and a pixel array in which the R pixel and B pixel are alternately arranged by interposing the W pixel therebetween are alternately arranged. In addition, in FIG. 20, for the color of the pixel 5, the white is denoted by "W".

In the pixel array in FIG. 20, as the different color pixels from each other at which the inter-pixel light shielding film 40 is provided, there are adjacent pixels of the W pixel and R pixel, the W pixel and G pixel, the W pixel and B pixel, the R pixel and G pixel, and the G pixel and B pixel. In addition, as the same color pixels as each other, there are adjacent pixels of W color pixels which are adjacent to each other in the diagonal direction.

It is possible to apply the present technology in the above described each pixel array. However, the present technology is not limited to the above described pixel arrays which is shown in FIGS. 17 to 20, and is applicable to pixel arrays which have the different color pixels from each other, and the same color pixels as each other. In addition, in the above described embodiment, the CMOS solid-state imaging device is exemplified, however, the present technology can be widely applied to a solid-state imaging device having the different color pixels from each other, and the same color pixels as each other as the pixel array, not to mention the CCD (Charge Coupled Device) solid-state imaging device.

In addition, the present technology can have the following configuration.

(1) A solid-state imaging device which includes, a pixel region which is provided on a semiconductor substrate, and in which a plurality of pixels including a photoelectric conversion unit having a photoelectric conversion function is arranged; a wiring layer which is provided at one plate surface of the semiconductor substrate; a color filter layer which is divided into a plurality of color filters provided corresponding to each pixel of the plurality of pixels which is arranged in the pixel region; and an inter-pixel light shielding unit which is provided in a boundary portion between the pixels adjacent to each other, and between the semiconductor substrate and the color filter layer, in which the pixel has a combination of different color pixels in which the colors of the color filter are different from each other, and a combination of the same color pixels in which the colors of the color filter are the same as each other, as the pixels which are adjacent to each other, due to the color of the color filter, and the inter-pixel light shielding units are biasedly located at the boundary portion of the combination of the different color pixels.

(2) The solid-state imaging device described in the (1), wherein the wiring layer and the color filter layer are provided on a different plate surface side from each other with respect to the semiconductor substrate, and the inter-pixel light shielding unit is a light shielding film.

(3) The solid-state imaging device described in the (2) further include, a peripheral circuit region which is provided at the periphery of the pixel region; and a peripheral light shielding film which is provided at the peripheral circuit region in between the semiconductor substrate and the color filter layer, and is located at the same layer as the light shielding film.

(4) The solid-state imaging device described in the (2) or (3), wherein the light shielding film is only present at the boundary portion of the combination of the different color pixels, without being present at the boundary portion of the combination of the same color pixels.

(5) The solid-state imaging device described in any one of the (2) to (4), wherein the light shielding film may be connected to a fixed potential.

(6) The solid-state imaging device described in any one of the (2) to (5), wherein the plurality of light shielding films which is present at the boundary portion of the plurality of pixels is electrically connected to each other by a transparent electrode.

(7) The solid-state imaging device described in the (1), wherein the wiring layer and the color filter layer are provided at the same plate surface as each other with respect to the semiconductor substrate, and the inter-pixel light shielding unit is a wiring which configures the wiring layer.

(8) The solid-state imaging device described in any one of the (1) to (7) may further include, a signal processing circuit which performs processing of an output signal from each of the pixels, wherein the signal processing circuit corrects an output value of the output signal from each of the pixels on the basis of the magnitude of a difference in sensitivity which occurs between the plurality of pixels due to a difference in the amount of the inter-pixel light shielding unit at the boundary portion which is present in the periphery of each of the pixels.

(9) An electronic apparatus which includes, the solid-state imaging device described in any one of the (1) to (8); and a drive unit which generates a driving signal for driving the solid-state imaging device.

(10) The electronic apparatus which includes, the solid-state imaging device described in any one of the (1) to (7); the drive unit which generates a driving signal for driving the solid-state imaging device; and a shutter device for controlling an irradiation time and a light blocking time of light with which irradiates the solid-state imaging device, wherein the drive unit corrects an output value of an output signal from each of the pixels on the basis of the magnitude of a difference in sensitivity which occurs between the plurality of pixels due to a difference in the amount of the inter-pixel light shielding unit at the boundary portion which is present in the periphery of each of the pixels.

The present disclosure contains subject matter related to that disclosed in Japanese Priority Patent Application JP 2011-065621 filed in the Japan Patent Office on Mar. 24, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a pixel region provided on a semiconductor substrate, and in which a plurality of pixels including a photoelectric conversion unit having a photoelectric conversion function are arranged;
    a wiring layer provided at one plate surface of the semiconductor substrate;
    a color filter layer divided into a plurality of color filters respectively corresponding to the pixels that are arranged in the pixel region;
    an inter-pixel light shielding unit provided in a boundary portion between pixels that are adjacent to each other, between the semiconductor substrate and the color filter layer; and
    a signal processing circuit configured to perform processing of an output signal from respective pixels,
    wherein the signal processing circuit corrects an output value of the output signal from the respective pixels on the basis of the magnitude of a difference in sensitivity which occurs between the plurality of pixels due to a difference in the amount of the inter-pixel light shielding unit at the boundary portion that is present in a periphery of the respective pixels,
    wherein the pixels include a combination of different color pixels in which the colors of the color filter are different from each other, and a combination of same color pixels in which the colors of the color filter are the same as each other, and
    wherein the inter-pixel light shielding unit is biasedly located at the boundary portion of the combination of the different color pixels.

2. The solid-state imaging device according to claim 1, wherein the wiring layer and the color filter layer are provided on a different plate surface side from each other with respect to the semiconductor substrate, and the inter-pixel light shielding unit is a light shielding film.

3. The solid-state imaging device according to claim 2, further comprising:
    a peripheral circuit region which is provided at the periphery of the pixel region; and
    a peripheral light shielding film which is provided at the peripheral circuit region in between the semiconductor substrate and the color filter layer, and is located at the same layer as the light shielding film.

4. The solid-state imaging device according to claim 2, wherein the light shielding film is only present at the boundary portion of the combination of the different color pixels, without being present at a boundary portion of the combination of the same color pixels.

5. The solid-state imaging device according to claim 2, wherein the light shielding film is configured for connection to a fixed potential.

6. The solid-state imaging device according to claim 5, wherein the light shielding film is one of a plurality of light shielding films that are present at boundary portions of the plurality of pixels, the plurality of light shielding films being electrically connected to each other by a transparent electrode.

7. The solid-state imaging device according to claim 1, wherein the wiring layer and the color filter layer are provided at the same plate surface as each other with respect to the semiconductor substrate, and
    wherein the inter-pixel light shielding unit is a wiring which configures the wiring layer.

8. An electronic apparatus comprising:
    a solid-state imaging device; and
    a drive unit configured to generate a driving signal for driving the solid-state imaging device,
    wherein the solid-state imaging device includes,
    a pixel region provided on a semiconductor substrate, and in which a plurality of pixels including a photoelectric conversion unit having a photoelectric conversion function are arranged;
    a wiring layer provided at one plate surface of the semiconductor substrate;
    a color filter layer divided into a plurality of color filters respectively corresponding to the plurality of pixels that are arranged in the pixel region;
    an inter-pixel light shielding unit provided in a boundary portion between pixels that are adjacent to each other, and between the semiconductor substrate and the color filter; and
    a shutter device configured to control an irradiation time and a blocking time that light irradiates the solid-state device,
    wherein the drive unit corrects an output value of an output signal from respective pixels the basis of the magnitude of a difference in sensitivity which occurs between the plurality of pixels due to a difference in the amount of the inter-pixel light shielding unit at the boundary portion that is present in the periphery of each of the pixels by controlling at least one of the irradiation time and the blocking time of the light,
    wherein the pixels include a combination of different color pixels in which the colors of the color filter are different from each other, and a combination of the same color pixels in which the colors of the color filter are the same as each other, and
    wherein the inter-pixel light shielding units are biasedly located at the boundary portion of the combination of the different color pixels.

9. An electronic apparatus comprising the solid-state imaging device according to claim 1.

10. The electronic apparatus according to claim 9, wherein the wiring layer and the color filter layer are provided on a different plate surface side from each other with respect to the semiconductor substrate, and the inter-pixel light shielding unit is a light shielding film.

11. The electronic apparatus according to claim 10, further comprising:
    a peripheral circuit region which is provided at the periphery of the pixel region; and
    a peripheral light shielding film which is provided at the peripheral circuit region in between the semiconductor substrate and the color filter layer, and is located at the same layer as the light shielding film.

12. The electronic apparatus according to claim 10,
wherein the light shielding film is only present at the boundary portion of the combination of the different color pixels, without being present at a boundary portion of the combination of the same color pixels.

13. The electronic apparatus according to claim 10,
wherein the light shielding film is configured for connection to a fixed potential.

14. The electronic apparatus according to claim 13,
wherein the light shielding film is one of a plurality of light shielding films that are present at boundary portions of the plurality of pixels, the plurality of light shielding films being electrically connected to each other by a transparent electrode.

15. The electronic apparatus according to claim 8,
wherein the wiring layer and the color filter layer are provided on a different plate surface side from each other with respect to the semiconductor substrate, and the inter-pixel light shielding unit is a light shielding film.

16. The electronic apparatus according to claim 15, further comprising:

a peripheral circuit region which is provided at the periphery of the pixel region; and a peripheral light shielding film which is provided at the peripheral circuit region in between the semiconductor substrate and the color filter layer, and is located at the same layer as the light shielding film.

17. The electronic apparatus according to claim 15,
wherein the light shielding film is only present at the boundary portion of the combination of the different color pixels, without being present at a boundary portion of the combination of the same color pixels.

18. The electronic apparatus according to claim 15,
wherein the light shielding film is configured for connection to a fixed potential.

19. The electronic apparatus according to claim 18,
wherein the light shielding film is one of a plurality of light shielding films that are present at boundary portions of the plurality of pixels, the plurality of light shielding films being electrically connected to each other by a transparent electrode.

* * * * *